(12) United States Patent
Kim et al.

(10) Patent No.: US 12,324,313 B2
(45) Date of Patent: Jun. 3, 2025

(54) DISPLAY DEVICE

(71) Applicant: Samsung Display Co., LTD., Yongin-si (KR)

(72) Inventors: Jin Taek Kim, Yongin-si (KR); Ki Nyeng Kang, Sejong-si (KR); Ock Soo Son, Seoul (KR); Hee Keun Lee, Suwon-si (KR); Su Min Choi, Hwaseong-si (KR); Kwang Taek Hong, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 843 days.

(21) Appl. No.: 17/463,975

(22) Filed: Sep. 1, 2021

(65) Prior Publication Data

US 2022/0223664 A1    Jul. 14, 2022

(30) Foreign Application Priority Data

Jan. 14, 2021    (KR) .......................... 10-2021-0005326

(51) Int. Cl.
*H10K 59/122*    (2023.01)
*H10K 59/126*    (2023.01)
(Continued)

(52) U.S. Cl.
CPC ......... *H10K 59/122* (2023.02); *H10K 59/126* (2023.02); *H10K 59/131* (2023.02); *H10K 59/38* (2023.02)

(58) Field of Classification Search
None
See application file for complete search history.

(56) References Cited

U.S. PATENT DOCUMENTS 10,170,534 B1    1/2019    Kim et al.
2016/0204373 A1    7/2016    Park
(Continued)

FOREIGN PATENT DOCUMENTS

KR    10-2016-0087982    7/2016
KR    10-2018-0003253    1/2018
(Continued)

OTHER PUBLICATIONS

International Search Report corresponding to International Application No. PCT/KR2022/000643 dated Apr. 22, 2022.
(Continued)

*Primary Examiner* — Xiaoming Liu
(74) *Attorney, Agent, or Firm* — KILE PARK REED & HOUTTEMAN PLLC

(57) ABSTRACT

A display device includes a substrate including a display area and a non-display area adjacent to the display area, a passivation layer disposed on the substrate, a via layer disposed on the passivation layer, sub-pixels including electrodes disposed on the via layer and light emitting elements disposed on the electrodes in the display area, a first bank disposed on the via layer and surrounding the sub-pixels in the display area, a second bank disposed on the via layer and spaced apart from the first bank in the non-display area, a third bank disposed on the via layer and spaced apart from the second bank in the non-display area, and a first valley disposed between the first bank and the second bank in the non-display area and penetrating the via layer and the passivation layer.

24 Claims, 21 Drawing Sheets

(51) Int. Cl.
  *H10K 59/131* (2023.01)
  *H10K 59/38* (2023.01)

(56) References Cited

U.S. PATENT DOCUMENTS

| | | | |
|---|---|---|---|
| 2019/0206973 A1* | 7/2019 | Kim | H10K 50/805 |
| 2020/0043976 A1* | 2/2020 | Kim | H01L 33/504 |
| 2020/0043997 A1* | 2/2020 | Sonoda | H10K 59/8722 |
| 2020/0075700 A1* | 3/2020 | Cao | H10K 59/873 |
| 2022/0068901 A1 | 3/2022 | Kong et al. | |

FOREIGN PATENT DOCUMENTS

| | | |
|---|---|---|
| KR | 10-2019-0031397 | 3/2019 |
| KR | 10-1994227 | 9/2019 |
| KR | 10-2020-0005692 | 1/2020 |
| KR | 10-2020-0031723 | 3/2020 |
| KR | 10-2020-0073340 | 6/2020 |
| KR | 10-2020-0075493 | 6/2020 |
| KR | 10-2020-0130606 | 11/2020 |

OTHER PUBLICATIONS

Written Opinion corresponding to International Application No. PCT/KR2022/000643 dated Apr. 22, 2022.

* cited by examiner

DISPLAY DEVICE

CROSS-REFERENCE TO RELATED APPLICATION(S)

This application claims priority to and benefits of Korean Patent Application No. 10-2021-0005326 under 35 U.S.C. 119, filed on Jan. 14, 2021 in the Korean Intellectual Property Office, the entire contents of which are incorporated herein by reference.

BACKGROUND

1. Technical Field

The disclosure relates to a display device.

2. Description of the Related Art

The importance of display devices has steadily increased with the development of multimedia technology. In response thereto, various types of display devices such as an organic light emitting display (OLED), a liquid crystal display (LCD) and the like are in use.

A display device is a device for displaying an image, and may include a display panel, such as an organic light emitting display panel or a liquid crystal display panel. A light emitting display panel may include light emitting elements, e.g., light emitting diodes (LED), and examples of a light emitting diode include an organic light emitting diode using an organic material as a light emitting material, and an inorganic light emitting diode using an inorganic material as a light emitting material.

SUMMARY

Aspects of the disclosure provide a display device that may be capable of preventing an organic material of an organic layer disposed on light emitting elements from overflowing to an undesired region.

However, aspects of the disclosure are not restricted to the above. The above and other aspects of the disclosure will become more apparent to one of ordinary skill in the art to which the disclosure pertains by referencing the detailed description of the disclosure given below.

A display device according to an embodiment may include structures adjacent to the inside of a non-display area and having an embossed or intaglio pattern shape. In the display device, since the structures may be disposed to be adjacent to (e.g., surround) a display area, it may be possible to prevent the organic material of the organic layer that may be disposed in the display area from overflowing to the outermost part of the non-display area.

It should be noted that the effects of the disclosure are not limited to the above, and other effects of the disclosure will be apparent from the following description.

According to an embodiment of the disclosure, a display device may include a substrate including a display area and a non-display area adjacent to the display area, a passivation layer disposed on the substrate, a via layer disposed on the passivation layer, sub-pixels each including electrodes disposed on the via layer and light emitting elements disposed on the electrodes in the display area, a first bank disposed on the via layer and surrounding the sub-pixels in the display area, a second bank disposed on the via layer and spaced apart from the first bank in the non-display area, a third bank disposed on the via layer and spaced apart from the second bank in the non-display area, and a first valley disposed between the first bank and the second bank in the non-display area and penetrating the via layer and the passivation layer.

The display device may further comprise a first insulating layer disposed on the electrodes, a second insulating layer disposed on the light emitting elements, and a third insulating layer disposed on the first insulating layer and the second insulating layer, wherein the first insulating layer and the third insulating layer may be disposed on the display area and the non-display area, and each of the first bank, the second bank, and the third bank may be disposed on the third insulating layer.

The display device may further comprise a first interlayer insulating layer disposed between the substrate and the passivation layer, wherein a portion of each of the first insulating layer and the third insulating layer may be disposed in the first valley, the first insulating layer may contact the first interlayer insulating layer exposed by the first valley, and the third insulating layer may be disposed on the first insulating layer in the non-display area.

Each of the sub-pixels may further include a first connection electrode disposed on the third insulating layer and electrically contacting one of the electrodes and the light emitting element, and a second connection electrode disposed between the third insulating layer and the second insulating layer and electrically contacting one of the electrodes and the light emitting element.

The display device may further comprise color control structures disposed in a region surrounded by the first bank in the display area, a first capping layer disposed on each of the color control structures and the first bank, a low refractive layer disposed on the first capping layer, and a second capping layer disposed on the low refractive layer.

The first capping layer may cover the second bank and the third bank, the low refractive layer may extend from the display area to the second bank, and at least a portion of the low refractive layer may be disposed in the first valley.

The first capping layer may be disposed on the third insulating layer on the second bank and the third bank.

The second capping layer may be disposed on the second bank and the third bank and contact the first capping layer.

The display device may further comprise an upper light absorbing member disposed on the second capping layer and overlapping the first bank, color filter layers disposed on the second capping layer in a region where the upper light absorbing member may be exposed, and an overcoat layer disposed on the upper light absorbing member and each of the color filter layers.

The display device may further comprise an upper structure disposed on the second bank and the third bank, wherein the overcoat layer may be disposed in the display area and the non-display area, and extends to the upper structure disposed on the second bank.

The display device may further comprise a second valley disposed between the second bank and the third bank in the non-display area and penetrating the via layer and the passivation layer.

A portion of each of the first insulating layer and the third insulating layer may be disposed in the second valley, and a portion of each of the first capping layer and the second capping layer may be disposed in the second valley and contact each other.

The display device may further comprise fourth banks directly disposed on the third insulating layer between the first bank and the first valley.

The display device may further comprise dummy pixels surrounding the sub-pixels disposed at an outermost part of the display area, the electrodes being disposed on the dummy pixels, and a fifth bank surrounding the dummy pixels at a boundary between the display area and the non-display area.

The display device may further comprise a first interlayer insulating layer disposed between the substrate and the passivation layer, a first wire disposed between the first interlayer insulating layer and the passivation layer at an outer side of the first valley, a second wire disposed between the interlayer insulating layer and the first passivation layer at an inner side of the first valley, and a first bridge wire disposed between the first interlayer insulating layer and the substrate and overlapping the first valley in a thickness direction, wherein each of the first wire and the second wire may contact the first wire and the second wire through a contact hole penetrating the first interlayer insulating layer.

According to an embodiment of the disclosure, a display device may comprise a display area and a non-display area adjacent to the display area, sub-pixels disposed in the display area and disposed in a first direction and in a second direction intersecting the first direction, each of the sub-pixels comprising a first electrode, a second electrode spaced apart from the first electrode, and light emitting elements disposed on the first electrode and the second electrode, a first insulating layer disposed in the display area and the non-display area and covering the first electrode and the second electrode, a first bank surrounding the sub-pixels in the display area, a first valley surrounding the first bank and spaced apart from the first bank in the non-display area, a second bank surrounding the first valley and spaced apart from the first valley in the non-display area, and a third bank surrounding the second bank and spaced apart from the second bank in the non-display area, wherein the first bank, the second bank, and the third bank have an embossed pattern shape and may be disposed on the first insulating layer, the first valley has an intaglio pattern shape, and a part of the first insulating layer may be disposed in the first valley.

The display device may further comprise fourth banks having an embossed pattern shape between the first bank and the first valley and disposed on the first insulating layer.

The fourth banks may extend in one direction and may be spaced apart from each other in the first direction and the second direction.

The fourth banks may have a length extending in the one direction greater than a gap between the fourth banks in the one direction.

The display device may further comprise a second valley having an intaglio pattern shape and disposed between the second bank and the third bank in the non-display area, wherein a part of the first insulating layer may be disposed in the second valley.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
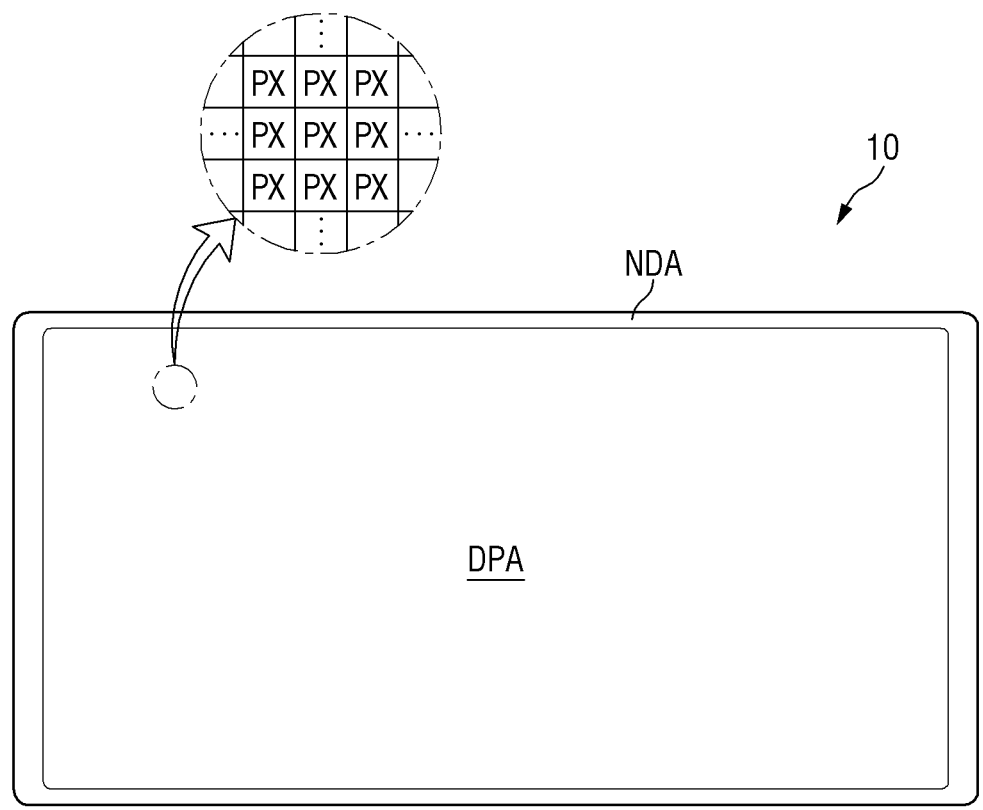
FIG. 1 is a schematic plan view illustrating a display device according to an embodiment.
Figure 1:
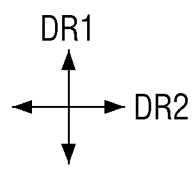

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well (and vice versa), unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." When an element is described as "not overlapping" or "to not overlap" another element, this may include that the elements are spaced apart from each other, offset from each other, or set aside from each other or any other suitable term as would be appreciated and understood by those of ordinary skill in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that the terms "connected to" or "coupled to" may include a physical or electrical connection or coupling.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view illustrating a display device according to an embodiment.

Referring to FIG. 1, a display device 10 may display a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which may provide a display screen.

The display device 10 may include a display panel which provides a display screen. Examples of the display panel may include an inorganic light emitting diode display panel, an organic light emitting display panel, a quantum dot light emitting display panel, a plasma display panel and a field emission display panel. In the following description, a case where an inorganic light emitting diode display panel may be applied as a display panel will be illustrated, but the disclosure is not limited thereto, and other display panels may be applied.

The shape of the display device 10 may be variously modified. For example, the display device 10 may have a shape such as a rectangular shape elongated in a horizontal direction, a rectangular shape elongated in a vertical direction, a square shape, a quadrilateral shape with rounded corners (vertices), another polygonal shape and a circular shape. The shape of a display area DPA of the display device 10 may also be similar to the overall shape of the display device 10. FIG. 1 illustrates a display device 10 having a rectangular shape elongated in a second direction DR2.

The display device 10 may include the display area DPA and a non-display area NDA. The display area DPA may be an area where a screen can be displayed, and the non-display area NDA may be an area where a screen may not be displayed. The display area DPA may also be referred to as an active region, and the non-display area NDA may also be referred to as a non-active region. The display area DPA may substantially occupy the center of the display device 10.

The display area DPA may include pixels PX. The pixels PX may be arranged in a matrix. The shape of each pixel PX may be a rectangular or square shape in plan view. However, the disclosure is not limited thereto, and it may be a rhombic shape in which each side may be inclined with respect to a direction. The pixels PX may be disposed in a stripe type or a Pentile® type. Each of the pixels PX may include one or more light emitting elements that emit light of a specific wavelength band to display a specific color.

The non-display area NDA may be disposed around the display area DPA. The non-display area NDA may completely or partially surround the display area DPA. The display area DPA may have a rectangular shape, and the non-display area NDA may be disposed adjacent to sides (e.g., four sides) of the display area DPA. The non-display area NDA may form a bezel of the display device 10. Wires or circuit drivers included in the display device 10 may be disposed in the non-display area NDA, or external devices may be mounted thereon.

Figure 2:
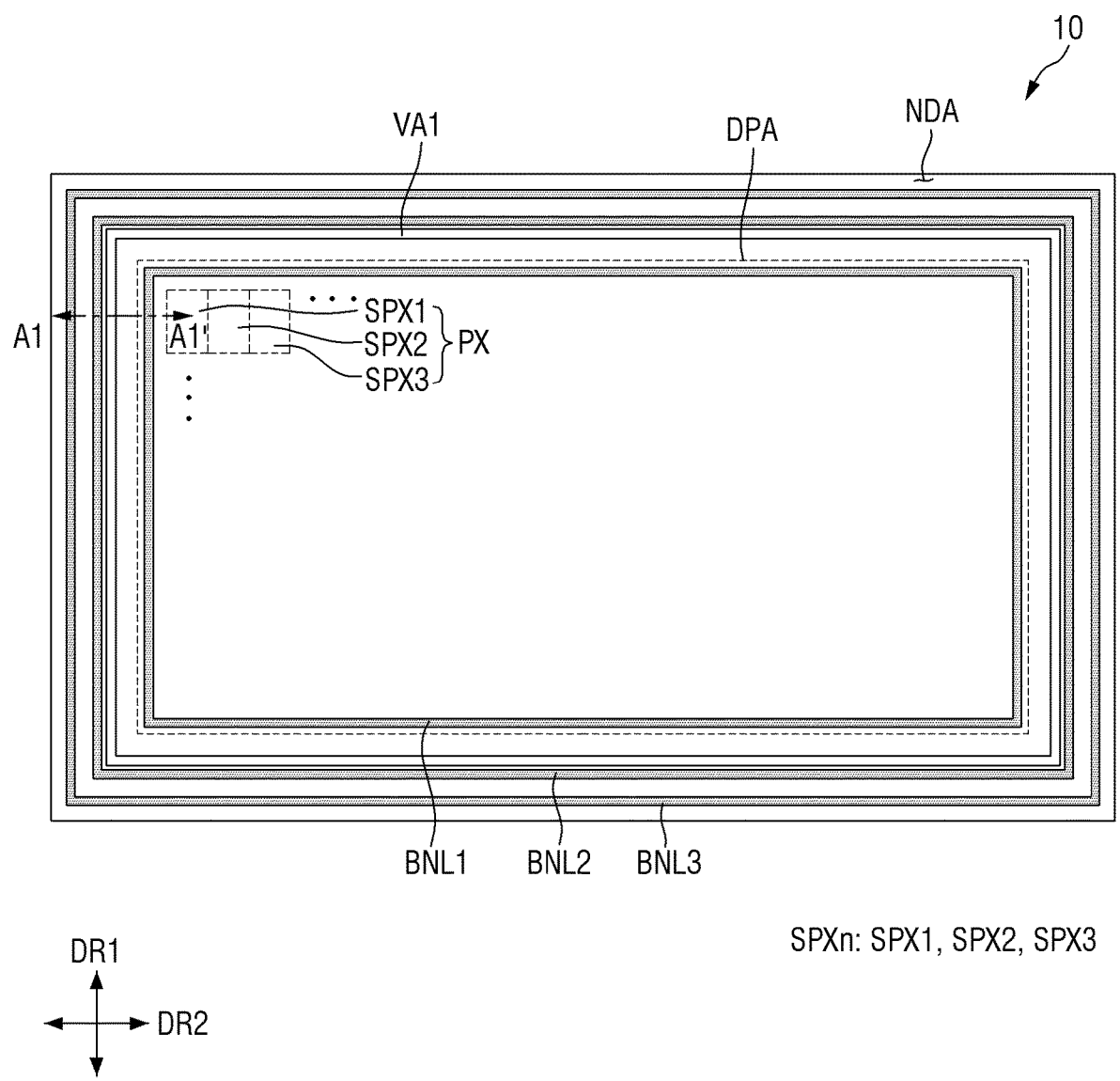
FIG. 2 is a schematic diagram illustrating a display area and a non-display area of a display device according to an embodiment.

FIG. 2 is a schematic diagram illustrating a display area and a non-display area of a display device according to an embodiment.

Referring to FIG. 2, the display device 10 according to an embodiment may include the pixels PX arranged in the display area DPA, a first bank BNL1 disposed at the outer part of the display area DPA, and a first valley VA1, a second bank BNL2, and a third bank BNL3 that may be arranged in the non-display area NDA to surround the display area DPA.

The pixels PX arranged in a first direction DR1 and the second direction DR2 may be disposed in the display area DPA, and a pixel PX may include multiple sub-pixels SPXn arranged in a direction. The sub-pixels SPXn may be arranged in the first direction DR1 and the second direction DR2 in the display area DPA, and some of them may form one pixel PX.

The first bank BNL1 may extend in the first direction DR1 and the second direction DR2 in the display area DPA. For example, the first bank BNL1 may be disposed at the outer part of the display area DPA to surround the portion where the pixels PX may be arranged. Further, although it is not illustrated in FIG. 2, the first bank BNL1 may extend across the display area DPA in the first direction DR1 or the second direction DR2, or may be disposed on the boundaries of the sub-pixels SPXn. The first bank BNL1 may distinguish the display area DPA and the non-display area NDA, and also may distinguish different sub-pixels SPXn.

The second bank BNL2 and the third bank BNL3 surrounding the display area DPA while being spaced apart from the first bank BNL1 may be arranged in the non-display area NDA. The second bank BNL2 may be spaced apart from the first bank BNL1 by a certain gap, and the third bank BNL3 may be spaced apart from the second bank BNL2 by a certain gap. In other words, the display area DPA may be disposed at the inner side of the region surrounded by the second bank BNL2, and the second bank BNL2 may be disposed at the inner side of the third bank BNL3.

As will be described later, the display device 10 may have a structure in which layers may be sequentially stacked on a substrate SUB. At least one of the layers of the display device 10 may be made of an organic material, and may be formed by a process of injecting (e.g., directly injecting) the organic material onto the substrate SUB. Since the organic material may flow with fluidity, the organic material injected onto the display area DPA may overflow to the non-display area NDA. The second bank BNL2 and the first bank BNL1 may prevent the organic material from overflowing to the outside beyond the non-display area NDA.

Further, the display device 10 according to an embodiment may include the first valley VA1 disposed between the first bank BNL1 and the second bank BNL2 in the non-display area NDA. The second bank BNL2 and the first bank BNL1 may have an upwardly protruding shape, whereas the first valley VA1 may be formed by partially depressing a part of a lower layer. The first valley VA1 may form an embossed and intaglio pattern together with the second bank BNL2 and the first bank BNL1, so that it may be possible to prevent the organic material injected onto the display area DPA from overflowing to the non-display area NDA.

In the following description, the pixel PX structure, the bank structures, and the valley structure of the display device 10 according to an embodiment will be described in detail with reference to other drawings.

Figure 3:
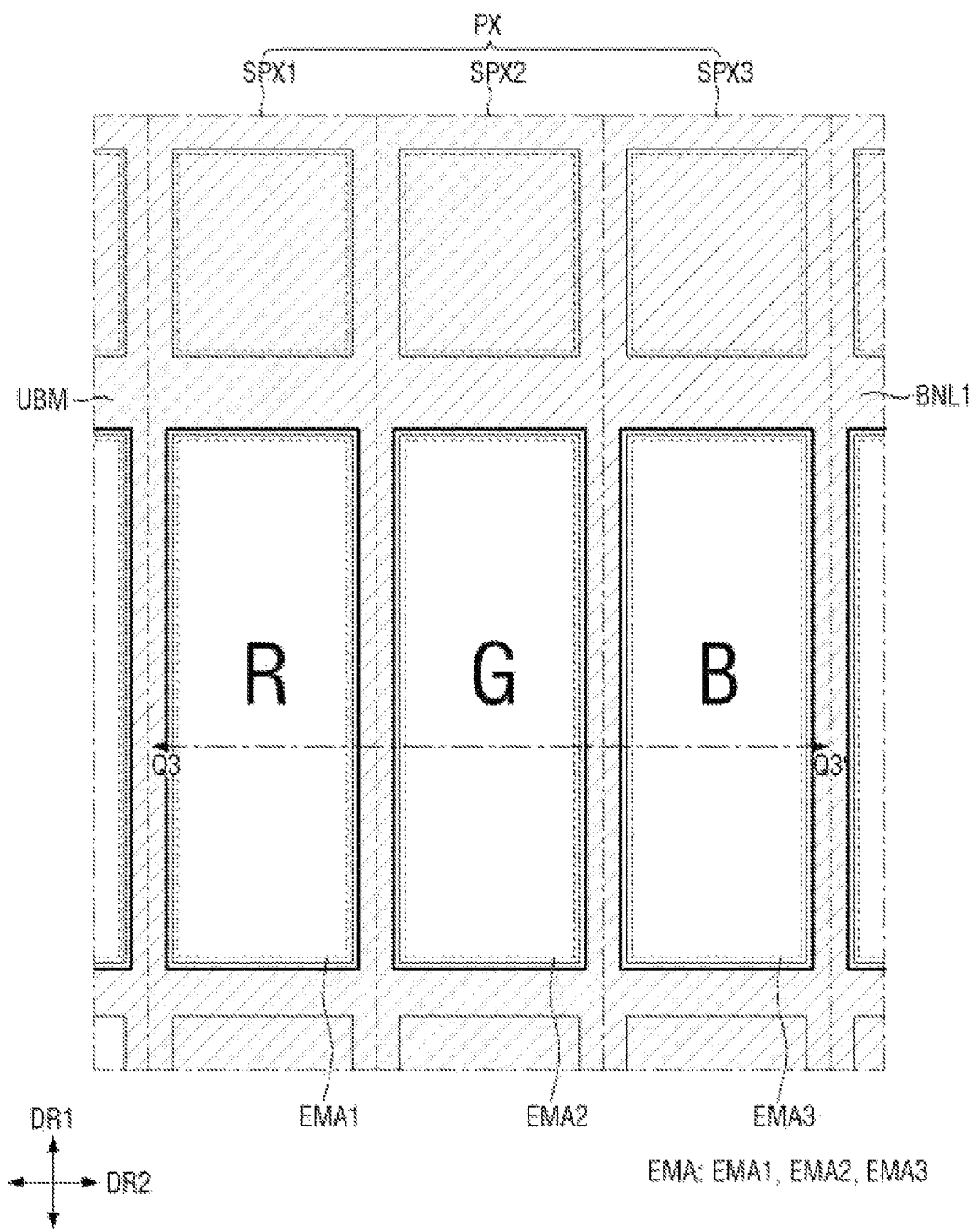
FIG. 3 is a schematic plan view showing color filter layers disposed in a pixel of a display device according to an embodiment.
Figure 4:
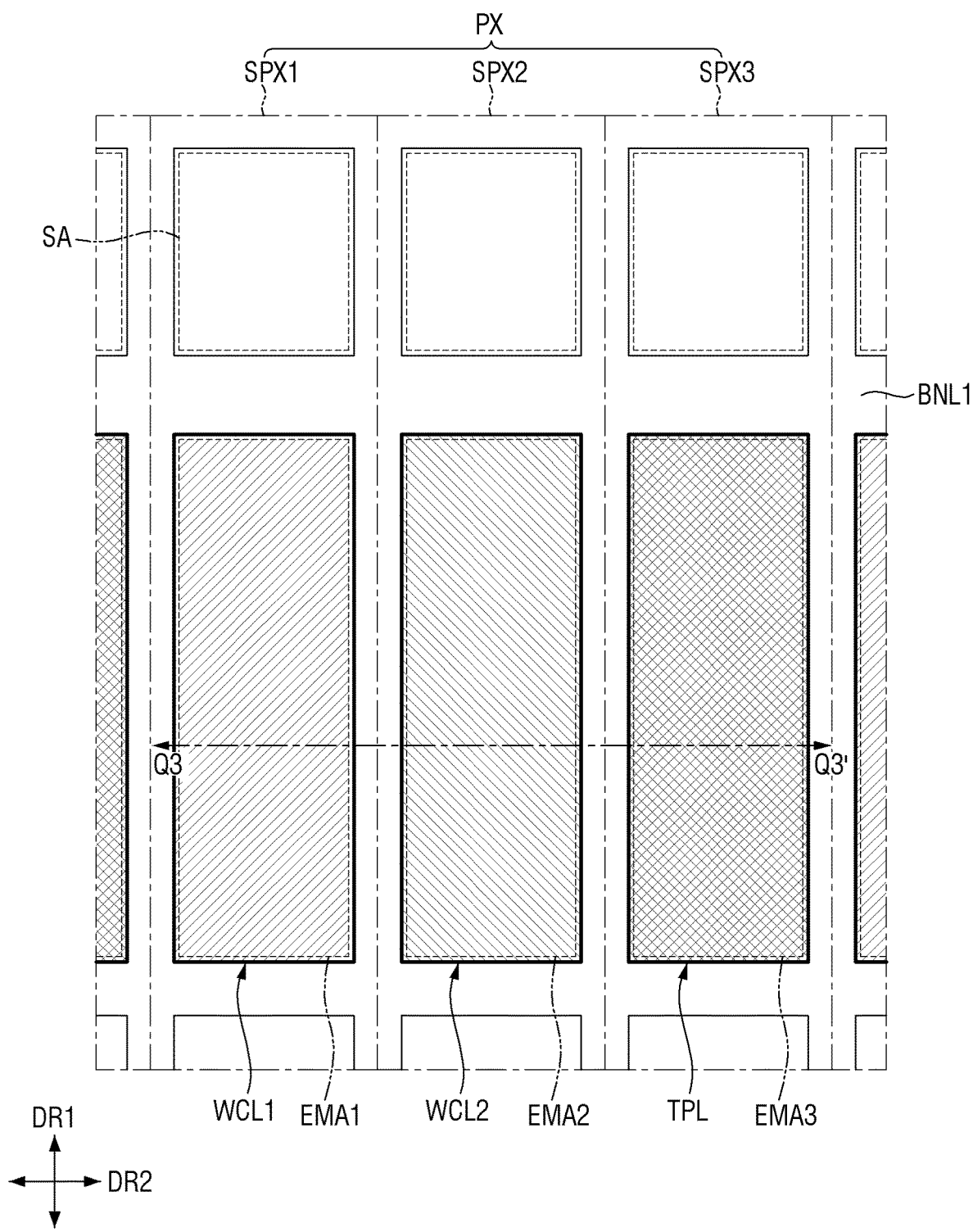
FIG. 4 is a schematic plan view showing color control structures disposed in a pixel of a display device according to an embodiment.
Figure 5:
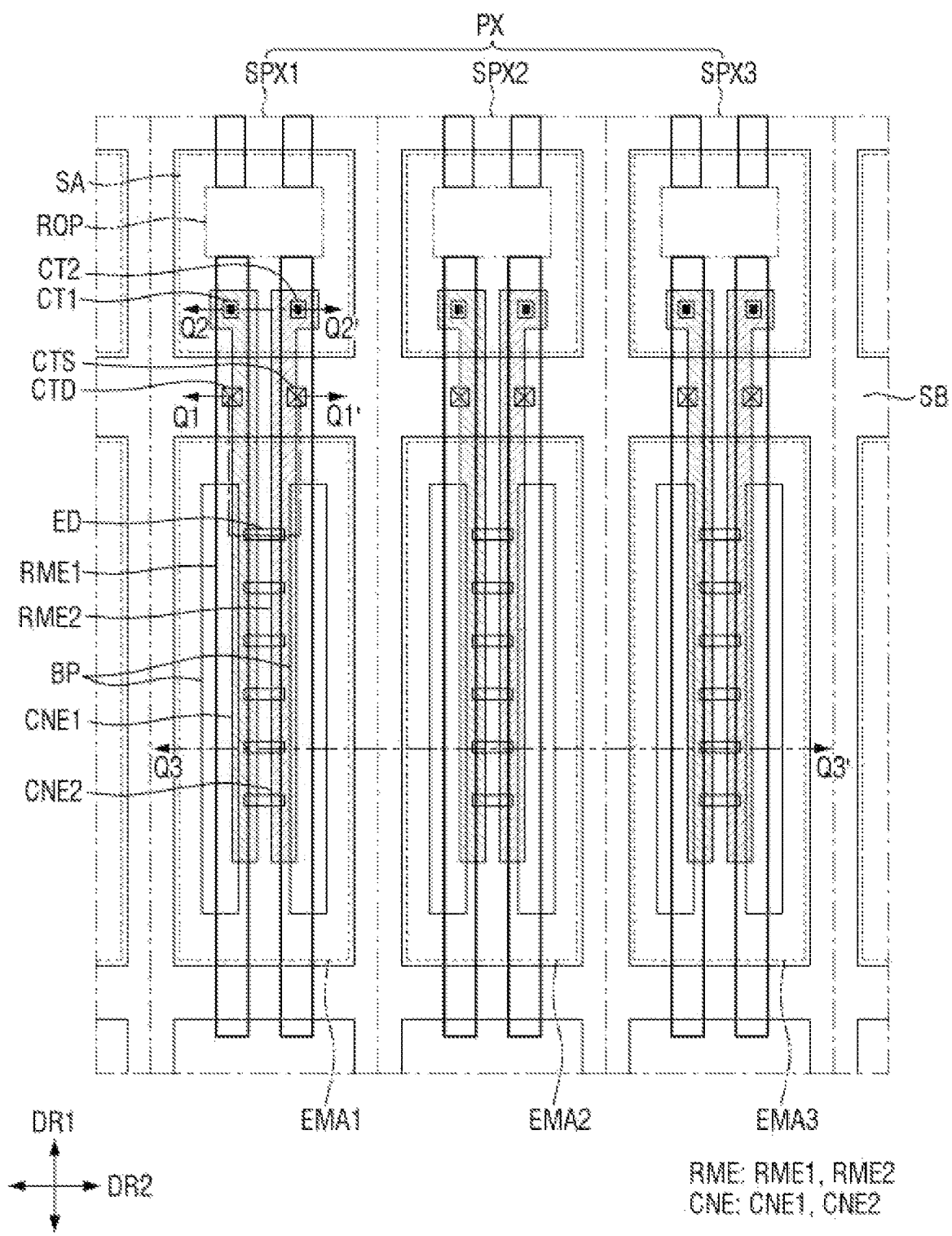
FIG. 5 is a schematic plan view showing electrodes and light emitting elements disposed in a pixel of a display device according to an embodiment.
Figure 6:
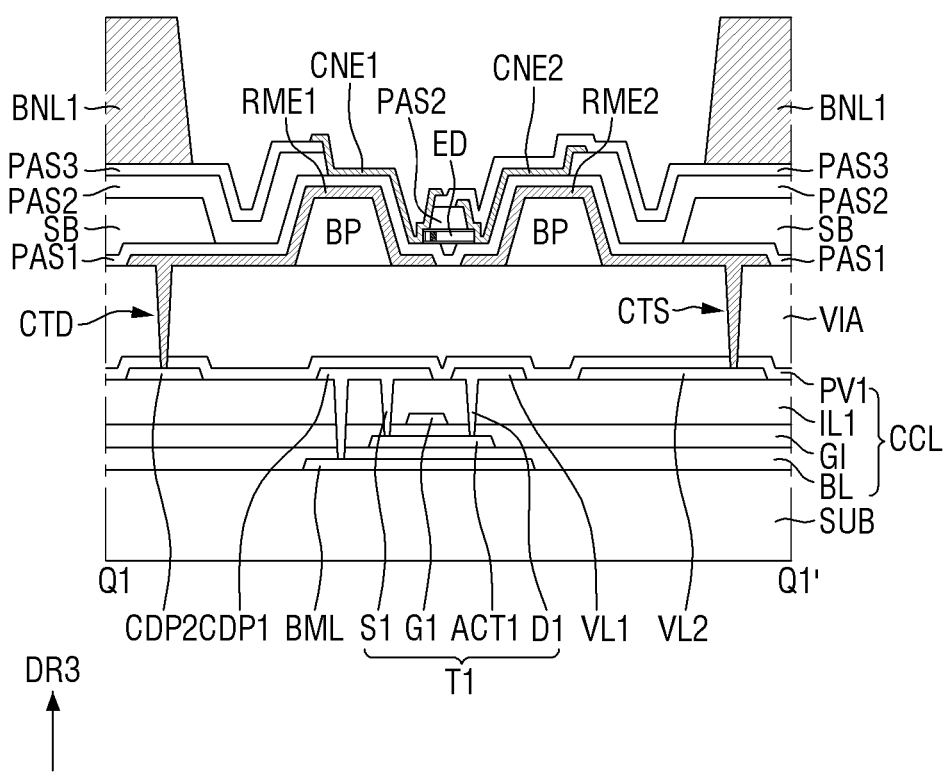
FIG. 6 is a schematic cross-sectional view taken along line Q1-Q1' of FIG. 5.
Figure 7:
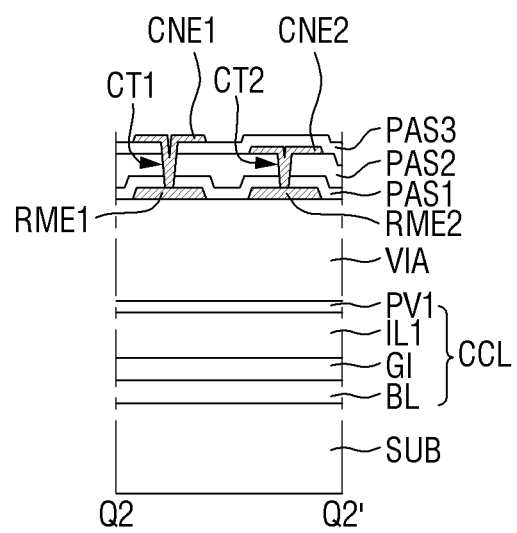
FIG. 7 is a schematic cross-sectional view taken along line Q2-Q2' of FIG. 5.
Figure 8:
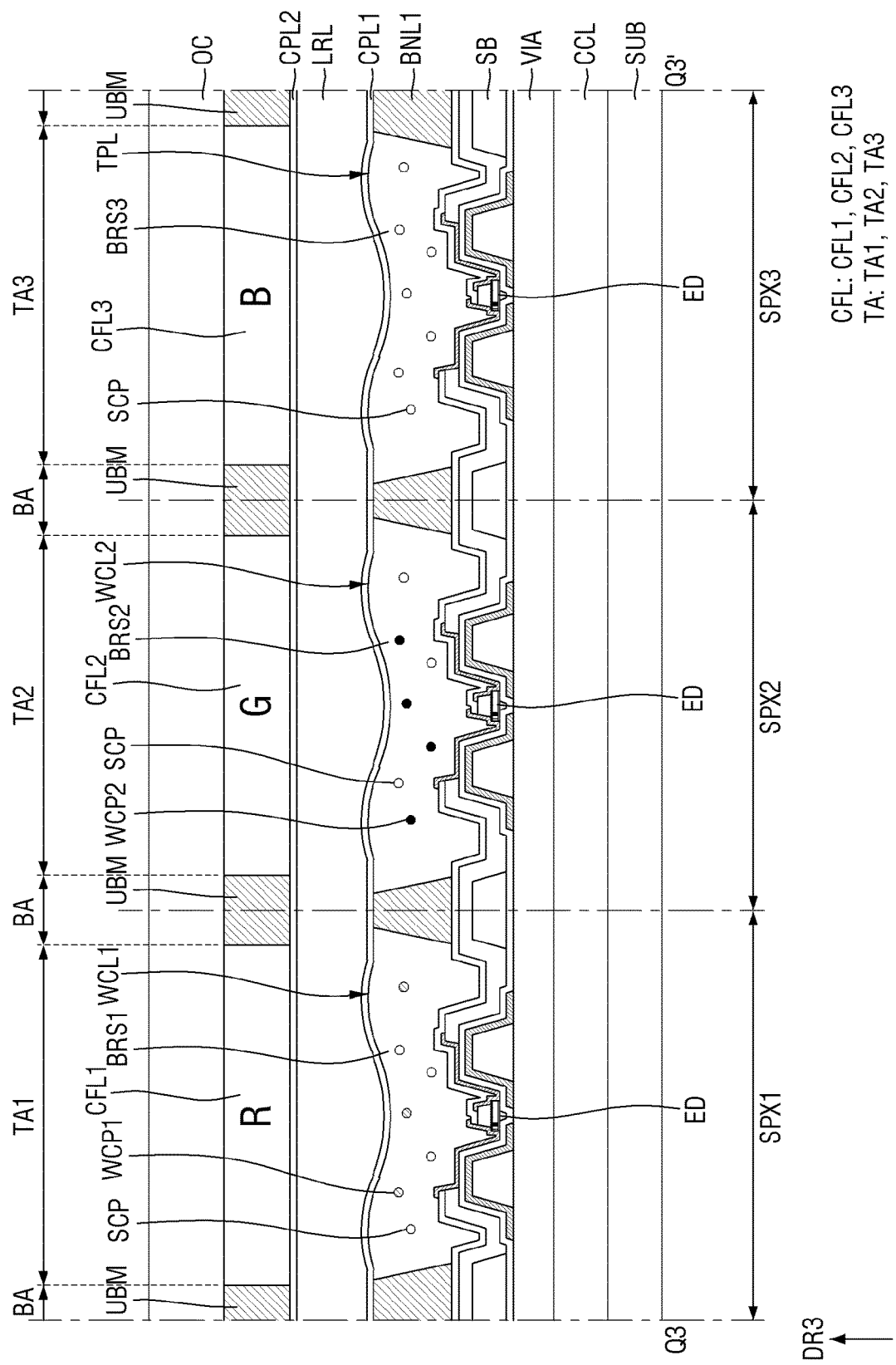
FIG. 8 is a schematic cross-sectional view taken along line Q3-Q3' of FIGS. 3, 4, and 5.

FIG. 3 is a schematic plan view showing color filter layers disposed in a pixel of a display device according to an embodiment. FIG. 4 is a schematic plan view showing color control structures disposed in a pixel of a display device according to an embodiment. FIG. 5 is a schematic plan view showing electrodes and light emitting elements disposed in a pixel of a display device according to an embodiment. FIG. 6 is a schematic cross-sectional view taken along line Q1-Q1' of FIG. 5. FIG. 7 is a schematic cross-sectional view taken along line Q2-Q2' of FIG. 5. FIG. 8 is a schematic cross-sectional view taken along line Q3-Q3' of FIGS. 3, 4, and 5. FIG. 6 shows a cross section across ends of a light emitting element ED disposed in a sub-pixel SPXn of the display area DPA, and FIG. 7 shows a cross section across contact portions CT1 and CT2 disposed in a sub-pixel SPXn. FIG. 8 shows a cross section across a pixel PX and shows a cross section of multiple color control structures TPL, WCL1, and WCL2, and a color filter layer CFL.

Referring to FIGS. 3 to 8, the display device 10 may include light emitting elements ED arranged on the substrate SUB, and the color control structures TPL, WCL1, and WCL2 and the color filter layer CFL disposed on the light emitting elements ED. The display device 10 may include the light emitting elements ED disposed in each sub-pixel SPXn to emit light, and the color control structures TPL, WCL1, and WCL2 and the color filter layer CFL that emit the light emitted from the light emitting elements ED in a color (e.g., another color).

Each of the pixels PX of the display device 10 may include sub-pixels SPXn (n ranging from 1 to 3). For example, a pixel PX may include a first sub-pixel SPX1, a second sub-pixel SPX2 and a third sub-pixel SPX3. The light emitting elements ED arranged in each sub-pixel SPXn of the display device 10 may emit the light of a same color, whereas the sub-pixels SPXn may display lights of different colors due to the color control structures TPL, WCL1, and WCL2, and the color filter layer CFL. In an example, in the display device 10, the first sub-pixel SPX1 may display light of a first color, the second sub-pixel SPX2 may display light of a second color, and the third sub-pixel SPX3 may display light of a third color, whereas the light emitting elements ED arranged in each sub-pixel SPXn may emit the light of the third color. For example, the first color may be red R, the second color may be green G, and the third color may be blue B. The color control structure disposed in the first sub-pixel SPX1 and the second sub-pixel SPX2 may convert the light of the third color into the light of the first color or the second color. However, the disclosure is not limited thereto, and different sub-pixels SPXn may include the light emitting elements ED that emit lights of different colors.

Each sub-pixel SPXn may include an emission region EMA and a non-emission region. The emission region EMA may be an area where the light emitting elements ED may be aligned to emit light of a certain wavelength band. The non-emission region may be an area where there may be no light emitting element ED and the light emitted from the light emitting elements ED may not reach, so that no light may be emitted. The emission region may include an area in which a light emitting element ED may be disposed, and an area adjacent to the light emitting element ED to emit light emitted from the light emitting element ED.

Without being limited thereto, the emission region EMA may also include an area in which light emitted from a light emitting element ED may be reflected or refracted by another component and emitted. The light emitting elements ED may be disposed in each sub-pixel SPXn, and the emission region may be formed to include an area where the light emitting elements ED may be disposed and an area adjacent thereto.

The emission region EMA may include a first emission region EMA1 disposed in the first sub-pixel SPX1, a second emission region EMA2 disposed in the second sub-pixel SPX2, and a third emission region EMA3 disposed in the third sub-pixel SPX3. In an embodiment in which the light emitting elements ED arranged in each sub-pixel SPXn emit light of a same color, the first emission region EMA1, the second emission region EMA2, and the third emission region EMA3 may emit light of a same color, e.g., light of the third color.

Although it is shown in the drawing that the sub-pixels SPXn have the emission regions EMA that may be substantially identical in size, the disclosure is not limited thereto. In some embodiments, the emission regions EMA of the sub-pixels SPXn may have different sizes according to a color or wavelength band of light emitted from a light emitting element ED disposed in each sub-pixel.

The sub-pixel SPXn may further include a sub-region SA disposed in the non-emission region. The sub-region SA may be disposed at a side of the emission region EMA in the first direction DR1, and may be disposed between the emission regions EMA of the sub-pixels SPXn adjacent in the first direction DR1. For example, the emission regions EMA and the sub-regions SA may be repeatedly arranged in the second direction DR2, respectively, while being alternately arranged in the first direction DR1. However, the disclosure is not limited thereto, and the arrangement of the emission regions EMA and the sub-regions SA in the pixels PX may be different from that shown in FIG. 3.

The display device 10 may include the first bank BNL1 and a sub-bank SB disposed between the sub-pixels SPXn and between the emission regions EMA and the sub-regions SA. The first bank BNL1 and the sub-bank SB may include a portion extending in the first direction DR1 and the second direction DR2 in plan view to be arranged in a grid pattern over the surface (e.g., entire surface) of the display area DPA. The first bank BNL1 may be disposed on the sub-bank SB, and the first bank BNL1 and the sub-bank SB may overlap in a thickness direction. The sub-bank SB and the first bank BNL1 may be arranged to distinguish different sub-pixels SPXn, the emission region EMA, and sub-region SA. The sub-bank SB and the first bank BNL1 may distinguish different objects. For example, the sub-bank SB may be disposed to surround the emission region EMA, and the light emitting elements ED may be arranged in the region surrounded by the sub-bank SB. The sub-bank SB may distinguish the light emitting elements ED arranged in different sub-pixels SPXn. The color control structures TPL, WCL1, and WCL2 may be arranged in the region surrounded by the first bank BNL1, and the first bank BNL1 may distinguish the color control structures TPL, WCL1, and WCL2 arranged in different sub-pixels SPXn.

To be more specific, the display device 10 may include the substrate SUB, and an active layer, conductive layers, and insulating layers that may be arranged on the substrate SUB. The semiconductor layer, the conductive layers, and the insulating layers may each constitute a circuit layer CCL and a display element layer of the display device 10. The display element layer may include electrodes RME and the light emitting elements ED and may be connected to the circuit layer CCL. The display device 10 may include the color control structures TPL, WCL1, and WCL2 and the color filter layer CFL arranged on the display element layer.

The substrate SUB may be an insulating substrate. The substrate SUB may be made of an insulating material such as glass, quartz, polymer resin, or a combination thereof. Further, the substrate SUB may be a rigid substrate, but may also be a flexible substrate which can be bent, folded or rolled.

A first conductive layer may be disposed on the substrate SUB. The first conductive layer may include a lower metal layer BML that may be disposed to overlap an active layer ACT1 of a first transistor T1. The lower metal layer BML may include a material of blocking light to prevent light from reaching the active layer ACT1 of the first transistor T1. However, the lower metal layer BML may be omitted.

The buffer layer BL may be disposed on the lower metal layer BML and the substrate SUB. The buffer layer BL may be formed on the substrate SUB to protect the transistors of the pixel PX from moisture permeating through the substrate SUB susceptible to moisture permeation, and may perform a surface planarization function.

The active layer may be disposed on the buffer layer BL. The active layer may include the active layer ACT1 of the first transistor T1. The first active layer ACT1 of the first transistor T1 may be disposed to partially overlap a first gate electrode G1 of a second conductive layer to be described later.

The active layer may include polycrystalline silicon, monocrystalline silicon, oxide semiconductor, and the like, or a combination thereof. In another embodiment, the active layer may include polycrystalline silicon. The oxide semiconductor may be an oxide semiconductor including indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

Although it is illustrated in the drawing that one first transistor T1 may be disposed in the sub-pixel SPXn of the display device 10, the disclosure is not limited thereto, and the display device 10 may include a larger number of transistors.

The first gate insulating layer GI may be disposed on the active layer and the buffer layer BL. The first gate insulating layer GI may serve as a gate insulating layer of the first transistor T1.

The second conductive layer may be disposed on the first gate insulating layer GI. The second conductive layer may include the first gate electrode G1 of the first transistor T1. The first gate electrode G1 may be arranged to overlap the channel region of the first active layer ACT1 in the third direction DR3 which may be the thickness direction.

A first interlayer insulating layer IL1 may be disposed on the second conductive layer. The first interlayer insulating layer IL1 may function as an insulating layer between the second conductive layer and other layers disposed thereon, and may protect the second conductive layer.

A third conductive layer may be disposed on the first interlayer insulating layer IL1. The third conductive layer may include voltage wires VL1 and VL2, and electrode patterns CDP1 and CDP2.

Each of the first voltage wire VL1 and the second voltage wire VL2 may be disposed in the display area DPA and be electrically connected to a light emitting element ED of each sub-pixel SPXn. The first voltage wire VL1 may be applied with a high potential voltage (or a first power voltage) transmitted to the first electrode RME1, and the second voltage wire VL2 may be applied with a low potential voltage (or a second power voltage) transmitted to the second electrode RME2. A part of the first voltage wire VL1 may be in contact with the first active layer ACT1 of the first transistor T1 through the contact hole penetrating the first interlayer insulating layer IL1 and the first gate insulating layer GI. The first voltage wire VL1 may serve as a first drain electrode D1 of the first transistor T1.

In some embodiments, the first voltage wire VL1 may be applied with the first power voltage, and the first transistor T1 may be connected to the first voltage wire VL1. The first voltage wire VL1 may serve as the first drain electrode D1 of the first transistor T1.

Although not shown in the drawing, the voltage wires VL1 and VL2 may have a shape extending in the first direction DR1 in the display area DPA and the non-display area NDA. Further, each of the voltage wires VL1 and VL2 may further include a portion extending in the second direction DR2 in the display area DPA and the non-display area NDA, and the same voltage wires may be connected to each other while including the portion extending in the second direction DR2. The voltage wires VL1 and VL2 may be arranged in a mesh type structure on the display device 10 (e.g., entire display device 10).

The first electrode pattern CDP1 may be in contact with the first active layer ACT1 of the first transistor T1 through the contact hole penetrating the first interlayer insulating layer IL1 and the first gate insulating layer GI. Further, the first electrode pattern CDP1 may be in contact with the lower metal layer BML through another contact hole. The first electrode pattern CDP1 may serve as a first source electrode Si of the first transistor T1.

The second electrode pattern CDP2 may be electrically connected to the first transistor T1 through the first electrode pattern CDP1. Although it is illustrated in the drawing that the first electrode pattern CDP1 and the second electrode pattern CDP2 may be spaced apart from each other, the first electrode pattern CDP1 and the second electrode pattern CDP2 may be connected to each other directly or through a pattern of another layer. In some embodiments, the second electrode pattern CDP2 may be integrated with the first electrode pattern CDP1 to form a single pattern. The second electrode pattern CDP2 may also be connected to the first electrode RME1, and the first transistor T1 may transmit the first power voltage applied from the first voltage wire VL1 to the first electrode RME1.

On the other hand, although it is illustrated in the drawing that the first electrode pattern CDP1 and the second electrode pattern CDP2 may be formed on a same layer, the disclosure is not limited thereto. In some embodiments, the second electrode pattern CDP2 may be formed as a fourth conductive layer disposed on the third conductive layer with several insulating layers interposed between the first electrode pattern CDP1 and another conductive layer, e.g., the third conductive layer. The voltage wires VL1 and VL2 may also be formed as the fourth conductive layer instead of the third conductive layer, and the first voltage wire VL1 may be electrically connected to the first drain electrode D1 of the first transistor T1 through another conductive pattern. Further, although it is not illustrated in the drawing, each of the second conductive layer and the third conductive layer may further include a capacitance electrode of a storage capacitor. The capacitance electrodes of the storage capacitor may be arranged in different layers and form a capacitor in the first interlayer insulating layer IL1 therebetween. In some embodiments, each of the capacitance electrodes of the storage capacitor and the first gate electrode G1 and the source electrode S1 of the first transistor T1 may be formed integrally with each other. However, the disclosure is not limited thereto.

A passivation layer PV1 may be disposed on the third conductive layer. The passivation layer PV1 may serve to protect wires or conductive patterns of the third conductive layer.

The buffer layer BL, the first gate insulating layer GI, the first interlayer insulating layer IL1, and the passivation layer PV1 described above may be formed of inorganic layers stacked in an alternating manner. For example, the buffer layer BL, the first gate insulating layer GI, the first interlayer insulating layer ILL and the passivation layer PV1 may be formed as a double layer formed by stacking, or a multilayer formed by alternately stacking, inorganic layers including at least one of silicon oxide (SiOx), silicon nitride (SiNx), and silicon oxynitride (SiOxNy). However, the disclosure is not limited thereto, and the buffer layer BL, the first gate insulating layer GI, the first interlayer insulating layer ILL and the passivation layer PV1 may be formed as a single inorganic layer including the above-described insulating material. Further, in some embodiments, the first interlayer insulating layer IL1 may be made of an organic insulating material such as polyimide (PI) or the like.

The second conductive layer and the third conductive layer may be formed as a single layer or multiple layers made of at least one of molybdenum (Mo), aluminum (Al), chromium (Cr), gold (Au), titanium (Ti), nickel (Ni), neodymium (Nd), and copper (Cu), or an alloy thereof. However, the disclosure is not limited thereto.

A via layer VIA may be disposed on the passivation layer PV1. The via layer VIA may include an organic insulating material, for example, an organic insulating material such as polyimide (PI), to perform a surface planarization function.

The electrodes RME (RME1 and RME2), protruding patterns BP, the sub-bank SB, the light emitting elements ED, and the connection electrodes CNE (CNE1 and CNE2) may be disposed on the via layer VIA. Further, insulating layers PAS1, PAS2, and PAS3 may be disposed on the via layer VIA.

The protruding patterns BP may be disposed on (e.g., directly disposed on) the via layer VIA in the display area DPA. The protruding patterns BP may have a shape extending in the first direction DR1 and be spaced apart from each other in the second direction DR2. For example, the protruding pattern BP may extend in the first direction DR1 in the emission region EMA of each sub-pixel SPXn, and may be disposed at both sides in the second direction DR2 with respect to the center of the emission region EMA. The protruding patterns BP may be spaced apart from each other in the second direction DR2, and the light emitting elements ED may be disposed therebetween.

The extension length of the protruding patterns BP in the first direction DR1 may be smaller than the length in the first direction DR1 of the emission region EMA surrounded by the first bank BNL1. The protruding patterns BP may be arranged in the emission region EMA of the sub-pixel SPXn in the display area DPA (e.g., entire display area DPA) to form an isolated (e.g., island-shaped) pattern having a small width and extending in a direction.

The protruding pattern BP may have a structure in which at least a part thereof protrudes with respect to the top surface of the via layer VIA. The protruding portion of the protruding pattern BP may have inclined side surfaces, and the light emitted from a light emitting element ED may be reflected by the electrode RME disposed on the protruding pattern BP and emitted in an upward direction from the via layer VIA. However, the disclosure is not limited thereto, and the protruding pattern BP may have a semicircular or semi-elliptical shape having a curved outer surface. The protruding pattern BP may include an organic insulating material such as polyimide (PI), but is not limited thereto.

The electrodes RME may be arranged in the display area DPA. The first electrode RME1 and the second electrode RME2 may have a shape extending in a direction and may be arranged for each sub-pixel SPXn. The first electrode RME1 and the second electrode RME2 may be arranged over at least the emission region EMA and the sub-region SA of the sub-pixel SPXn while extending in the first direction DR1, and may be spaced apart from each other in the second direction DR2.

The first electrode RME1 and the second electrode RME2 may be spaced apart relative to each other in the first direction DR1 in the emission region EMA, and may be partially disposed in the sub-region SA of the corresponding sub-pixel SPXn and another sub-pixel SPXn adjacent in the first direction DR1 over the first bank BNL1. The first electrode RME1 and the second electrode RME2 of different sub-pixels SPXn may be separated with respect to the separation portion ROP located in the sub-region SA of one sub-pixel SPXn.

The first electrode RME1 and the second electrode RME2 may be disposed on different protruding patterns BP, respectively. The first electrode RME1 may be located on the left side with respect to the center of the emission region EMA, and may be partially disposed on the protruding pattern BP located on the left side. The second electrode RME2 may be located on the right side with respect to the center of the emission region EMA while being spaced apart from the first electrode RME1 in the second direction DR2. The second electrode RME2 may be partially disposed on the protruding pattern BP located on the right side.

The first electrode RME1 and the second electrode RME2 may be arranged at least on the inclined side surfaces of the protruding pattern BP. The first electrode RME1 and the second electrode RME2 may be arranged to cover at least one side surface of the protruding pattern BP and reflect the light emitted from a light emitting element ED.

Further, a gap between the first electrode RME1 and the second electrode RME2 in the second direction DR2 may be smaller than a gap between the protruding patterns BP. At least a part of the first electrode RME1 and the second electrode RME2 may be arranged on (e.g., directly arranged on) the via layer VIA, so that the first electrode RME1 and the second electrode RME2 may be arranged on a same plane.

The first electrode RME1 and the second electrode RME2 may be connected to the third conductive layer through a first electrode contact hole CTD and a second electrode contact hole CTS formed in the portions where they overlap the sub-bank SB, respectively. The first electrode RME1 may be in contact with the second electrode pattern CDP2 through the first electrode contact hole CTD penetrating the via layer VIA thereunder. The second electrode RME2 may be in contact with the second voltage wire VL2 through the second electrode contact hole CTS penetrating the via layer VIA thereunder. The first electrode RME1 may be electrically connected to the first transistor T1 through the second electrode pattern CDP2 and the first electrode pattern CDP1 and applied with the first power voltage. The second electrode RME2 may be electrically connected to the second voltage wire VL2 and applied with the second power voltage.

The first electrode RME1 and the second electrode RME2 may be electrically connected to a light emitting element ED. The first electrode RME1 and the second electrode RME2 may be connected to the light emitting element ED through the connection electrodes CNE (CNE1 and CNE2) to be described later, and may transmit the electrical signal applied from the lower conductive layer to the light emitting element ED.

Each of the electrodes RME may include a conductive material having high reflectivity. For example, the electrode RME may include a metal such as silver (Ag), copper (Cu), or aluminum (Al) as a material having high reflectivity, or may be an alloy including aluminum (Al), nickel (Ni), lanthanum (La), and the like. The electrode RME may reflect the light emitted from a light emitting element ED and proceeding toward the side surface of the protruding pattern BP in an upward direction from each sub-pixel SPXn.

However, the disclosure is not limited thereto, and each electrode RME may further include a transparent conductive material. For example, each electrode RME may include a material such as ITO, IZO, ITZO, or a combination thereof. In some embodiments, each of the electrodes RME may have a structure in which at least one transparent conductive material and at least one metal layer having high reflectivity may be stacked on each other, or may be formed as one layer including the materials. For example, each electrode RME may have a stacked structure of ITO/Ag/ITO, ITO/Ag/IZO, ITO/Ag/ITZO/IZO, or the like.

The first insulating layer PAS1 may be disposed on the via layer VIA and the electrodes RME. The first insulating layer PAS1 may be disposed to entirely cover the electrodes RME. The first insulating layer PAS1 may protect the electrodes RME, while insulating them from each other. Further, as will be described later, the first insulating layer PAS1 may also be disposed in the non-display area NDA. The first insulating layer PAS1 may also prevent a light emitting element ED disposed thereon from being damaged by direct contact with the electrode RME.

In an embodiment, the first insulating layer PAS1 may have stepped portions such that the top surface thereof may be partially depressed between the electrodes RME spaced apart in the second direction DR2. A light emitting element ED may be disposed on the top surface of the first insulating layer PAS1, where the stepped portions may be formed, and thus a space may remain between the light emitting element ED and the first insulating layer PAS1.

The first insulating layer PAS1 may include contact portions CT1 and CT2 that expose a part of the top surface of each electrode RME. The contact portions CT1 and CT2 may penetrate the first insulating layer PAS1, and the connection electrodes CNE, which will be described later, may be in contact with the exposed electrodes RME through the contact portions CT1 and CT2.

The sub-bank SB may be disposed on the first insulating layer PAS1. The sub-bank SB may include the portion extending in the first direction DR1 and the second direction DR2 in plan view and surround the display area DPA to be arranged in a grid pattern in the display area DPA. The sub-bank SB may be disposed on the boundaries of the sub-pixels SPXn to distinguish the adjacent sub-pixels SPXn. Further, the sub-bank SB may be disposed to surround the emission region EMA and the sub-region SA in the display area DPA, and the regions that may be opened and partitioned by the sub-bank SB may be the emission region EMA and the sub-region SA.

The sub-bank SB may have a constant height. In some embodiments, the height of the top surface of the sub-bank SB may be greater than that of the protruding pattern BP and the thickness of the sub-bank SB may be greater than or equal to that of the protruding pattern BP. The sub-bank SB may, but not necessarily, include polyimide, similarly to the protruding pattern BP.

On the other hand, in some embodiments, each of the sub-bank SB and the protruding pattern BP may be integrated with the via layer VIA. The via layer VIA may have a portion adjacent to the central portion of the emission region EMA of the sub-pixel SPXn and having a partially depressed top surface, and the depressed portion may correspond to the portion between the protruding patterns BP spaced apart from each other. Further, in an embodiment in which the sub-bank SB and the protruding pattern BP may be integrated with the via layer VIA, the top surface of the via layer VIA except the depressed portion may be flat, and the stepped portion formed between the protruding pattern BP and the sub-bank SB shown in FIG. 6 may be eliminated.

The light emitting elements ED may be arranged on the first insulating layer PAS1. A light emitting element ED may be disposed on the first electrode RME1 and the second electrode RME2 of each sub-pixel SPXn in the display area DPA.

The light emitting elements ED may be arranged on the first electrode RME1 and the second electrode RME2 spaced apart from each other in the second direction DR2 between the protruding patterns BP. The light emitting elements ED may be spaced apart from each other along the first direction DR1 in which the first electrode RME1 and the second electrode RME2 extend, and may be aligned substantially parallel to each other. A light emitting element ED may have a shape extending in a direction, and the extension length thereof may be greater than the gap between the first electrode RME1 and the second electrode RME2 spaced apart from each other in the second direction DR2. The light emitting elements ED may be arranged such that both ends thereof may be located on the first electrode RME1 and the second electrode RME2, respectively, and the direction in which the first electrode RME1 and the second electrode RME2 extend and the direction in which a light emitting element ED extends may be substantially perpendicular to each other. However, the disclosure is not limited thereto, and a light emitting element ED may be disposed in a direction oblique to the extension direction of the first electrode RME1 and the second electrode RME2.

A light emitting element ED may include layers arranged in a direction parallel to the top surface of the substrate SUB. A light emitting element ED of the display device 10 may be disposed such that one extension direction thereof may be parallel to the substrate SUB, and the semiconductor layers included in the light emitting element ED may be sequentially arranged in a direction parallel to the top surface of the substrate SUB. However, the disclosure is not limited thereto. In some cases, in case that a light emitting element ED has a different structure, the layers may be arranged in a direction perpendicular to the substrate SUB.

The light emitting elements ED may include semiconductor layers, and a first end and a second end opposite thereto may be defined with respect to any one semiconductor layer. A light emitting element ED may be disposed such that the first end may be disposed on the first electrode RME1 and the second end may be disposed on the second electrode RME2. The first end of the light emitting element ED may be directed to the left side that may be the other side in the second direction DR2.

The light emitting elements ED may be electrically connected to the first electrode RME1 and the second electrode RME2 while being in contact with the first connection electrode CNE1 and the second connection electrode CNE2, respectively. Since a part of the semiconductor layer may be exposed at the end surface of the light emitting element ED extending in a direction, the exposed semiconductor layer may be in contact with the connection electrode CNE. The light emitting elements ED may be electrically connected to the electrode RME or the conductive layers below the via layer VIA through the connection electrodes CNE, and may be applied with an electrical signal to emit light of a specific wavelength band.

The second insulating layer PAS2 may be disposed on the light emitting elements ED. In an example, the second insulating layer PAS2 may be disposed to partially surround the outer surfaces of the light emitting elements ED without covering both sides or both ends of a light emitting element ED. The portion of the second insulating layer PAS2 disposed on the light emitting element ED may extend in the first direction DR1 in plan view to form a linear or an isolated (e.g., island-shaped) pattern. The second insulating layer PAS2 may protect the light emitting elements ED while fixing the light emitting elements ED during the fabricating process of the display device 10. Further, the second insulating layer PAS2 may be disposed to fill the space between a light emitting element ED and the first insulating layer PAS1 thereunder.

Further, the second insulating layer PAS2 may also be disposed on the protruding pattern BP and the sub-bank SB in the display area DPA. The second insulating layer PAS2 may be disposed on the first insulating layer PAS1 while exposing the sides of a light emitting element ED and partially exposing the portions where the electrodes RME may be disposed.

The second insulating layer PAS2 may also be partially disposed in the sub-region SA. After the light emitting elements ED may be arranged, the first insulating layer PAS1 and the second insulating layer PAS2 may be partially removed in the sub-region SA, and a part of the via layer VIA may be exposed at the separation portion ROP. The third insulating layer PAS3 may be disposed on (e.g., directly disposed on) the exposed portion of the via layer VIA.

The connection electrodes CNE (CNE1 and CNE2) and the third insulating layer PAS3 may be arranged on the second insulating layer PAS2.

The connection electrodes CNE may be arranged on the light emitting elements ED and the electrode RME. The connection electrodes CNE may be partially disposed on the second insulating layer PAS2 and may be insulated from another connection electrode CNE by the second insulating layer PAS2 and the third insulating layer PAS3. Each of the connection electrodes CNE may be in contact with a light emitting element ED and the electrodes RME.

The connection electrodes CNE may be arranged in the display area DPA. The first connection electrode CNE1 may have a shape extending in the first direction DR1 and may be disposed on the first electrode RME1. The first connection electrode CNE may be in contact with the first electrode RME1 through a first contact portion CT1 exposing the top surface of the first electrode RME1, and may be in contact with the first ends of the light emitting elements ED. The second connection electrode CNE2 may have a shape extending in the first direction DR1 and may be disposed on the second electrode RME2. The second connection electrode CNE2 may be in contact with the second electrode RME2 through a second contact portion CT2 exposing the top surface of the second electrode RME2, and may be in contact with the second ends of the light emitting elements ED. The first connection electrode CNE1 and the second connection electrode CNE2 may transmit the electrical signal applied to the first electrode RME1 or the second electrode RME2 to an end of a light emitting element ED. Each of the first connection electrode CNE1 and the second connection electrode CNE2 may be in direct contact with the semiconductor layer exposed at both end surfaces of the light emitting element ED.

The contact portions CT1 and CT2 may be disposed so as not to overlap the light emitting elements ED in the second direction DR2. For example, the contact portions CT1 and CT2 may be formed to be spaced apart from the area, in which the light emitting elements ED may be disposed, in the first direction DR1. Although it is illustrated in the drawing that the contact portions CT1 and CT2 may be arranged in the sub-region SA, the disclosure is not limited thereto, and the contact portion CT1 and CT2 may be formed at the portion in the emission region EMA where there may be no light emitting element ED.

The connection electrodes CNE may be spaced apart from each other in the second direction DR2 in plan view. The first connection electrode CNE1 and the second connection electrode CNE2 may not be connected to (e.g., directly connected to) each other while being spaced apart from each other by a certain gap. Different connection electrodes CNE may not be connected to each other while being spaced apart from each other, and may be insulated from each other by the third insulating layer PAS3 disposed therebetween.

The connection electrodes CNE may include a conductive material. For example, they may include ITO, IZO, ITZO, aluminum (Al), or the like, or a combination thereof. As an example, the connection electrodes CNE may include a transparent conductive material, and light emitted from a light emitting element ED may pass through the connection electrodes CNE and proceed toward the electrodes RME. However, the disclosure is not limited thereto.

The third insulating layer PAS3 may be disposed on the second connection electrode CNE2 and the second insulating layer PAS2. The third insulating layer PAS3 may be disposed on the second insulating layer PAS2 (e.g., entire second insulating layer) PAS2 to cover the second connection electrode CNE2, and the first connection electrode CNE1 may be disposed on the third insulating layer PAS3. The third insulating layer PAS3 may be disposed on the via layer VIA (e.g., entire via layer VIA) except the region where the first connection electrode CNE1 may be disposed. The third insulating layer PAS3 may be disposed on the protruding pattern BP and the sub-bank SB as well as the first insulating layer PAS1 and the second insulating layer PAS2. Further, as will be described later, the third insulating layer PAS3 may also be disposed in the non-display area NDA. The third insulating layer PAS3 may insulate the first connection electrode CNE1 and the second connection electrode CNE2 to prevent direct contact therebetween.

Each of the first insulating layer PAS1, the second insulating layer PAS2 and the third insulating layer PAS3 described above may include an inorganic insulating material or an organic insulating material. However, the disclosure is not limited thereto.

The display device 10 may include the color control structures TPL, WCL1, and WCL2 and the color filter layer CFL arranged on the light emitting elements ED. The sub-pixels SPXn of the display area DPA may be distinguished by the sub-bank SB and the first bank BNL1 disposed thereon, and the color control structures TPL, WCL1, and WCL2 may be disposed in the emission region EMA surrounded by the first bank BNL1. The color filter layer CFL may be disposed on the color control structures TPL, WCL1, and WCL2 to correspond to the emission region EMA of each sub-pixel SPXn.

The display device 10 may include light transmitting areas TA where the color filter layer CFL may be disposed and light may be emitted, and a light blocking area BA where no light may be emitted between the light transmitting areas TA. The light transmitting area TA may be located to correspond to a part of the emission region EMA of each sub-pixel SPXn, and the light blocking area BA may be an area other than the light transmitting area TA. As will be described later, the light transmitting area TA and the light blocking area BA may be distinguished by an upper light absorbing member UBM.

The first bank BNL1 may overlap the sub-bank SB in the display area DPA. The first bank BNL1 may surround the area where the sub-pixels SPXn may be arranged at the outer part of the display area DPA and may include a portion extending in the first direction DR1 and the second direction DR2 in the display area DPA to be arranged in a grid pattern. In other words, the first bank BNL1 may also be disposed to surround the emission region EMA of each sub-pixel SPXn.

In accordance with an embodiment, the first bank BNL1 may be disposed on (e.g., directly disposed on) the third insulating layer PAS3, and the bottom surface of the first bank BNL1 may be in direct contact with the third insulating layer PAS3. The first bank BNL1 may be formed after the light emitting elements ED and the electrodes RME forming the display element layer, the connection electrodes CNE, and the third insulating layer PAS3 may be formed. As described above, the sub-bank SB may distinguish adjacent sub-pixels SPXn in the process of arranging the light emitting elements ED of the display element layer, whereas the first bank BNL1 may distinguish adjacent sub-pixels SPXn in the process of forming the color control structures TPL, WCL1, and WCL2. The first bank BNL1 and the sub-bank SB may have substantially the same planar arrangement. However, the first bank BNL1 may be higher than the sub-bank SB, and may form the space where the color control structures TPL, WCL1, and WCL2 including an organic material may be arranged.

The color control structures TPL, WCL1, and WCL2 may be arranged on the light emitting elements ED. The color control structures TPL, WCL1, and WCL2 may be arranged in the region surrounded by the first bank BNL1. The color control structures TPL, WCL1, and WCL2 may be arranged in the emission region EMA surrounded by the first bank BNL1 to form an isolated (e.g., island-shaped) pattern in the display area DPA. However, the disclosure is not limited thereto, and the color control structures TPL, WCL1, and WCL2 may be arranged over the sub-pixels SPXn while extending in a direction to form a linear pattern in the display area DPA.

In an embodiment in which a light emitting element ED of each sub-pixel SPXn emits blue light of the third color, the color control structures TPL, WCL1, and WCL2 may include the first wavelength conversion layer WCL1 disposed in the first sub-pixel SPX1, the second wavelength conversion layer WCL2 disposed in the second sub-pixel SPX2, and the light transmitting layer TPL disposed in the third sub-pixel SPX3.

The first wavelength conversion layer WCL1 may include a first base resin BRS1 and a first wavelength conversion material WCP1 provided in the first base resin BRS1. The second wavelength conversion layer WCL2 may include a second base resin BRS2 and a second wavelength conversion material WCP2 provided in the second base resin BRS2. The first wavelength conversion layer WCL1 and the second wavelength conversion layer WCL2 may transmit the blue light of the third color incident from a light emitting element ED while converting the wavelength thereof. The first wavelength conversion layer WCL1 and the second wavelength conversion layer WCL2 may further include a scatterer SCP included in each base resin, and the scatterer SCP may increase wavelength conversion efficiency.

The light transmitting layer TPL may include a third base resin BRS3 and the scatterer SCP included in the third base resin BSR3. The light transmitting layer TPL may transmit the blue light of the third color incident from a light emitting element ED while maintaining the wavelength thereof. The scatterers SCP of the light transmitting layer TPL may serve to control an emission path of the light emitted through the light transmitting layer TPL. The light transmitting layer TPL may not include a wavelength conversion material.

The scatterers SCP may be metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like, or a combination thereof. Examples of a material of the organic particles may include acrylic resin and urethane resin, and the like, or a combination thereof.

The first to third base resins BRS1, BRS2, and BRS3 may include a light transmitting organic material. For example, the first to third base resins BRS1, BRS2, and BRS3 may include an epoxy resin, an acrylic resin, a cardo resin, an imide resin, or the like, or a combination thereof. The first to third base resins BRS1, BRS2 and BRS3 may be formed of the same material, but the disclosure is not limited thereto.

The first wavelength conversion material WCP1 may convert the blue light of the third color into the red light of the first color, and the second wavelength conversion material WCP2 may convert the blue light of the third color into the green light of the second color. The first wavelength conversion material WCP1 and the second wavelength conversion material WCP2 may be quantum dots, quantum bars, phosphors or the like. Examples of the quantum dot may include group IV nanocrystal, group II-VI compound nanocrystal, group III-V compound nanocrystal, group IV-VI nanocrystal, or a combination thereof.

The color control structures TPL, WCL1, and WCL2 may be disposed on (e.g., directly disposed on) the first connection electrode CNE1 and the third insulating layer PAS3. In the display device 10, light emitting elements ED that emits light and the color control structures TPL, WCL1, and WCL2 may be continuously arranged on a substrate SUB. The first bank BNL1 may be disposed to surround the region where the light emitting elements ED may be arranged with a height, and the base resins BRS1, BRS2, and BRS3 of the color control structures TPL, WCL1, and WCL2 may be arranged on (e.g., directly arranged on) the third insulating layer PAS3 in the region surrounded by the first bank BNL1. The scatterers SCP and the wavelength conversion materials WCP1 and WCP2 of the color control structures TPL, WCL1, and WCL2 may be arranged around the light emitting elements ED in each of the base resins BRS1, BRS2, and BRS3.

A light emitting element ED of each sub-pixel SPXn may emit the blue light of the same third color, and the sub-pixels SPXn may emit lights of different colors. For example, the light emitted from a light emitting element ED disposed in the first sub-pixel SPX1 may be incident on the first wavelength conversion layer WCL1, the light emitted from a light emitting element ED disposed in the second sub-pixel SPX2 may be incident on the second wavelength conversion layer WCL2, and the light emitted from a light emitting element ED disposed in the third sub-pixel SPX3 may be incident on the light transmitting layer TPL. The light incident on the first wavelength conversion layer WCL1 may be converted into red light, the light incident on the second wavelength conversion layer WCL2 may be converted into green light, and the light incident on the light transmitting layer TPL may be transmitted as the same blue light without wavelength conversion. Although each sub-pixel SPXn may include light emitting elements ED that may emit the light of the same color, lights of different colors may be emitted depending on the arrangement of the color control structures TPL, WCL1, and WCL2 arranged thereabove.

On the other hand, although the case where the top surfaces of the layers of the color control structures TPL, WCL1, and WCL2 may not be flat and the edges adjacent to the first bank BNL1 may be higher than the central portions is illustrated in the drawing, the disclosure is not limited thereto. The top surfaces of the layers of the color control structures TPL, WCL1, and WCL2 may be flat, or the central portions may be higher unlike the case shown in the drawing.

An encapsulation structure formed of layers may be disposed on the color control structures TPL, WCL1, and WCL2. The encapsulation structure may include a first capping layer CPL1, a second capping layer CPL2, and a low refractive layer LRL disposed therebetween.

The first capping layer CPL1 may be disposed on the color control structures TPL, WCL1, and WCL2. The first capping layer CPL1 may be disposed to cover the color control structures TPL, WCL1, and WCL2 and the first bank BNL1. The first capping layer CPL1 may prevent impurities such as moisture or air from permeating from the outside and damaging or contaminating the color control structures TPL, WCL1, and WCL2. Further, the first capping layer CPL1 may prevent the materials of the color control structures TPL, WCL1, and WCL2 from being diffused to other components. The first capping layer CPL1 may be made of an inorganic material.

The low refractive layer LRL may be disposed on the first capping layer CPL1. The low refractive layer LRL that may be an optical layer for recycling the light having transmitted the color control structures TPL, WCL1, and WCL2 may improve the light emission efficiency and the color purity of the display device 10. The low refractive layer LRL may be made of an organic material having a low refractive index and may compensate the stepped portions formed by the color control structures TPL, WCL1, and WCL2 and the first bank BNL1.

The second capping layer CPL2 may be disposed on the low refractive layer LRL. The second capping layer CPL2 may prevent impurities such as moisture or air from permeating from the outside and damaging or contaminating the low refractive layer LRL. Further, the second capping layer CPL2 may prevent the material of the low refractive layer LRL from diffusing to other components. The second capping layer CPL2 may be formed of an inorganic material.

The upper light absorbing member UBM may be disposed to overlap the first bank BNL1 on the second capping layer CPL2. The upper light absorbing member UBM may be formed in a grid pattern to partially expose one surface of the second capping layer CPL2. The upper light absorbing member UBM may be disposed to cover the sub-regions SA of the sub-pixels SPXn in addition to the first bank BNL1 in plan view. The region where the upper light absorbing member UBM may not be disposed may be the light transmitting area TA where the color filter layer CFL may be disposed and light may be emitted.

The upper light absorbing member UBM may include an organic material. The upper light absorbing member UBM may reduce color distortion due to reflection of external light by absorbing the external light. In an embodiment, the upper light absorbing member UBM may absorb all visible light wavelengths. The upper light absorbing member UBM may include a light absorbing material. For example, the upper light absorbing member UBM may be made of a material used as a black matrix of the display device 10.

On the other hand, in some embodiments, the display device 10 may not include the upper light absorbing member UBM, and the upper light absorbing member UBM may be replaced with a material that absorbs light of a specific wavelength among visible light wavelengths and transmits light of another specific wavelength. The upper light absorbing member UBM may be replaced with a color pattern including the same material as that of at least one of the color filter layers CFL. For example, the color pattern including the material of any one of the color filter layers or a structure in which multiple color patterns are stacked may be disposed in the region where the upper light absorbing member UBM may be disposed. A description thereof may refer to other embodiments.

The color filter layers CFL may be arranged on the second capping layer CPL2 of the encapsulation structure. The color filter layer CFL may include a colorant such as a dye or a pigment that absorbs light of a wavelength other than a specific wavelength. The color filter layer CFL may be disposed in each sub-pixel SPXn to transmit only a part of the light incident on the color filter layer CFL in the corresponding sub-pixel SPXn. Each sub-pixel SPXn of the display device 10 may selectively display only the light that has transmitted the color filter layer CFL.

The color filter layers CFL may be disposed on the second capping layer CPL2 where the upper light absorbing member UBM may be exposed. Although different color filter layers CFL may be spaced apart from each other with the upper light absorbing member UBM interposed between, the disclosure is not limited thereto. In some embodiments, the color filter layers CFL may be partially arranged on the upper light absorbing member UBM while being spaced apart from each other. In another embodiment, the color filter layers CFL may partially overlap each other.

The color filter layer CFL may include a first color filter layer CFL1 disposed in the first sub-pixel SPX1, a second color filter layer CFL2 disposed in the second sub-pixel SPX2, and a third color filter layer CFL3 disposed in the third sub-pixel SPX3. Unlike the color control structures TPL, WCL1, and WCL2, the color filter layer CFL may be formed in an isolated (e.g., island-shaped) pattern corresponding to the emission region EMA. However, the disclosure is not limited thereto. The color filter layer CFL may form a linear pattern in the display area DPA (e.g., entire display area DPA).

In an embodiment, the first color filter layer CFL1 may be a red color filter layer, the second color filter layer CFL2 may be a green color filter layer, and the third color filter layer CFL3 may be a blue color filter layer. The lights emitted from the light emitting elements ED may be emitted through the color filter layer CFL while transmitting the color control structures TPL, WCL1, and WCL2.

A light emitting element ED disposed in the first sub-pixel SPX1 may emit blue light of the third color, and the light may be incident on the first wavelength conversion layer WCL1. The first base resin BRS1 of the first wavelength conversion layer WCL1 may be made of a transparent material, and a part of the light may transmit the first base resin BRS1 and be incident on the first capping layer CPL1 disposed thereon. However, at least a part of the light may be incident on the scatterer SCP and the first wavelength conversion material WCP1 arranged in the first base resin BRS1. The light may be scattered and subjected to wavelength conversion, and may be incident as red light on the first capping layer CPL1. The lights incident on the first capping layer CPL1 may be incident on the first color filter CFL1 while transmitting the first capping layer CPL1, the low refractive layer LRL, and the second capping layer CPL2 that may be made of a transparent material, and the first color filter layer CFL1 may block the transmission of lights other than the red light. Accordingly, the first sub-pixel SPX1 may emit the red light.

Similarly, the lights emitted from a light emitting element ED disposed in the second sub-pixel SPX2 may be emitted as green light while transmitting the second wavelength conversion layer WCL2, the first capping layer CPL1, the low refractive layer LRL, the second capping layer CPL2, and the second color filter layer CFL2.

A light emitting element ED disposed in the third sub-pixel SPX3 may emit blue light of the third color, and the light may be incident on the light transmitting layer. The third base resin BRS3 of the light transmitting layer TPL may be made of a transparent material, and a part of the light may transmit the third base resin BRS3 and be incident on the capping layer CPL1 disposed thereon. The lights incident on the first capping layer CPL1 may be incident on the third color filter layer CFL3 while transmitting the first capping layer CPL1, the low refractive layer LRL, and the second capping layer CPL2 that may be made of a transparent material, and the third color filter layer CFL3 may block the transmission of lights other than the blue light. Accordingly, the third sub-pixel SPX3 may emit the blue light.

In each sub-pixel SPXn, a part of the light incident on the first capping layer CPL1 may be reflected by the low refractive layer LRL and incident on the color control structures TPL, WCL1, and WCL2. The lights whose wavelengths may not be changed among the lights incident on the color control structures TPL, WCL1, and WCL2 may be incident on the first capping layer CPL1 after the colors thereof may be changed again. The low refractive layer LRL of the encapsulation structure may recycle a part of the light emitted from a light emitting element ED, so that the light emission efficiency of the display device 10 may be improved.

An overcoat layer OC may be disposed on the color filter layer CFL and the upper light absorbing member UBM. The overcoat layer OC may be disposed in the display area DPA (e.g., entire display area DPA), and may be partially disposed in the non-display area NDA. The overcoat layer OC may protect the members including an organic insulating material and may be arranged in the display area DPA from the outside.

Figure 9:
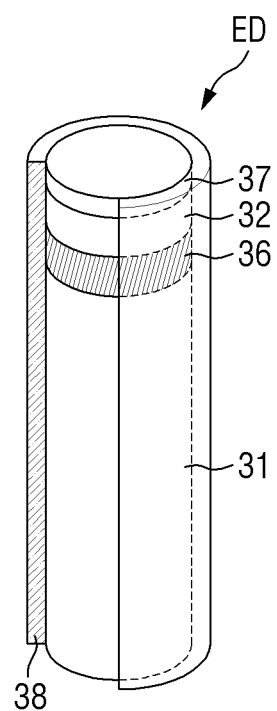
FIG. 9 is a schematic diagram of a light emitting element according to an embodiment.

FIG. 9 is a schematic diagram of a light emitting element according to an embodiment.

Referring to FIG. 9, a light emitting element ED may be a light emitting diode. The light emitting element ED may be an inorganic light emitting diode made of an inorganic material and having a nano-meter to micro-meter size. The light emitting element ED may be aligned between two electrodes having polarity in case that an electric field is formed in a specific direction between two electrodes opposing each other.

The light emitting element ED according to an embodiment may have a shape elongated in a direction. The light emitting element ED may have a shape of a cylinder, a rod, a wire, a tube, or the like. However, the shape of the light emitting element ED is not limited thereto, and the light emitting element ED may have a polygonal prism shape such as a regular cube, a rectangular parallelepiped and a hexagonal prism, or may have various shapes such as a shape elongated in a direction and having an outer surface partially inclined.

The light emitting element ED may include a semiconductor layer doped with any conductivity type (e.g., p-type or n-type) impurities. The semiconductor layer may emit light of a specific wavelength band by receiving an electrical signal applied from an external power source. The light emitting element ED may include a first semiconductor layer 31, a second semiconductor layer 32, a light emitting layer 36, an electrode layer 37 and an insulating layer 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be any one or more of n-type doped AlGaInN, GaN, AlGaN, InGaN, AlN and InN. The n-type dopant doped into the first semiconductor layer 31 may be Si, Ge, Sn, or the like, or a combination thereof.

The second semiconductor layer 32 may be disposed on the first semiconductor layer 31 with the light emitting layer 36 therebetween. The second semiconductor layer 32 may be a p-type semiconductor, and the second semiconductor layer 32 may include a semiconductor material having a chemical formula of $Al_xGa_yIn_{1-x-y}N$ ($0 \leq x \leq 1$, $0 \leq y \leq 1$, $0 \leq x+$ y≤1). For example, the second semiconductor layer 32 may be any one or more of p-type doped AlGaInN, GaN, AlGaN, InGaN, AlN and InN. The p-type dopant doped into the second semiconductor layer 32 may be Mg, Zn, Ca, Se, Ba, or the like, or a combination thereof.

Although it is illustrated in the drawing that the first semiconductor layer 31 and the second semiconductor layer 32 may be configured as one layer, the disclosure is not limited thereto. Depending on the material of the light emitting layer 36, the first semiconductor layer 31 and the second semiconductor layer 32 may further include a larger number of layers, such as a cladding layer or a tensile strain barrier reducing (TSBR) layer.

The light emitting layer 36 may be disposed between the first semiconductor layer 31 and the second semiconductor layer 32. The light emitting layer 36 may include a material having a single or multiple quantum well structure. In case that the light emitting layer 36 includes a material having a multiple quantum well structure, multiple quantum layers and well layers may be stacked alternately on each other. The light emitting layer 36 may emit light by coupling of electron-hole pairs according to an electrical signal applied through the first semiconductor layer 31 and the second semiconductor layer 32. The light emitting layer 36 may include a material such as AlGaN or AlGaInN. In an embodiment, in case that the light emitting layer 36 has a structure in which quantum layers and well layers may be alternately stacked in a multiple quantum well structure, the quantum layer may include a material such as AlGaN or AlGaInN, and the well layer may include a material such as GaN or AlInN.

The light emitting layer 36 may have a structure in which semiconductor materials having large band gap energy and semiconductor materials having small band gap energy may be alternately stacked on each other, and may include other group III to V semiconductor materials according to the wavelength band of the emitted light. The light emitted by the light emitting layer 36 is not limited to light of a blue wavelength band, but the active layer 36 may also emit light of a red or green wavelength band in some cases.

The electrode layer 37 may be an ohmic connection electrode. However, the disclosure is not limited thereto, and it may be a Schottky connection electrode. The light emitting element ED may include at least one electrode layer 37. The light emitting element ED may include one or more electrode layers 37, but the disclosure is not limited thereto, and the electrode layer 37 may be omitted.

In the display device 10, in case that the light emitting element ED is electrically connected to an electrode or a connection electrode, the electrode layer 37 may reduce the resistance between the light emitting element ED and the electrode or connection electrode. The electrode layer 37 may include conductive metal. For example, the electrode layer 37 may include at least one of aluminum (Al), titanium (Ti), indium (In), gold (Au), silver (Ag), ITO, IZO, and ITZO.

The insulating layer 38 may be arranged to surround the outer surfaces of the semiconductor layers and electrode layers described above. For example, the insulating layer 38 may be disposed to surround at least the outer surface of the light emitting layer 36, and may be formed to expose both ends of the light emitting element ED in the longitudinal direction. Further, in cross-sectional view, the insulating layer 38 may have a top surface, which may be rounded in a region adjacent to at least one end of the light emitting element ED.

The insulating layer 38 may include a material having insulating properties, such as silicon oxide ($SiO_x$), silicon nitride ($SiN_x$), silicon oxynitride ($SiO_xN_y$), aluminum nitride ($AlN_x$), aluminum oxide ($AlO_x$), or a combination thereof. It is illustrated in the drawing that the insulating layer 38 may be formed as a single layer, but the disclosure is not limited thereto. In some embodiments, the insulating layer 38 may be formed in a multilayer structure having multiple layers stacked on each other therein.

The insulating layer 38 may function to protect the members. The insulating layer 38 may prevent an electrical short circuit that may be likely to occur at the light emitting layer 36 in case that an electrode to which an electrical signal may be transmitted may be in direct contact with the light emitting element ED. The insulating layer 38 may prevent a decrease in light emission efficiency of the light emitting element ED.

Further, the insulating layer 38 may have an outer surface which may be surface-treated. The light emitting elements ED may be aligned in such a way of spraying the ink in which the light emitting elements ED may be dispersed on the electrodes. Here, the surface of the insulating layer 38 may be treated in a hydrophobic or hydrophilic manner in order to keep the light emitting elements ED in a dispersed state without aggregation with other light emitting elements ED adjacent in the ink.

Figure 10:
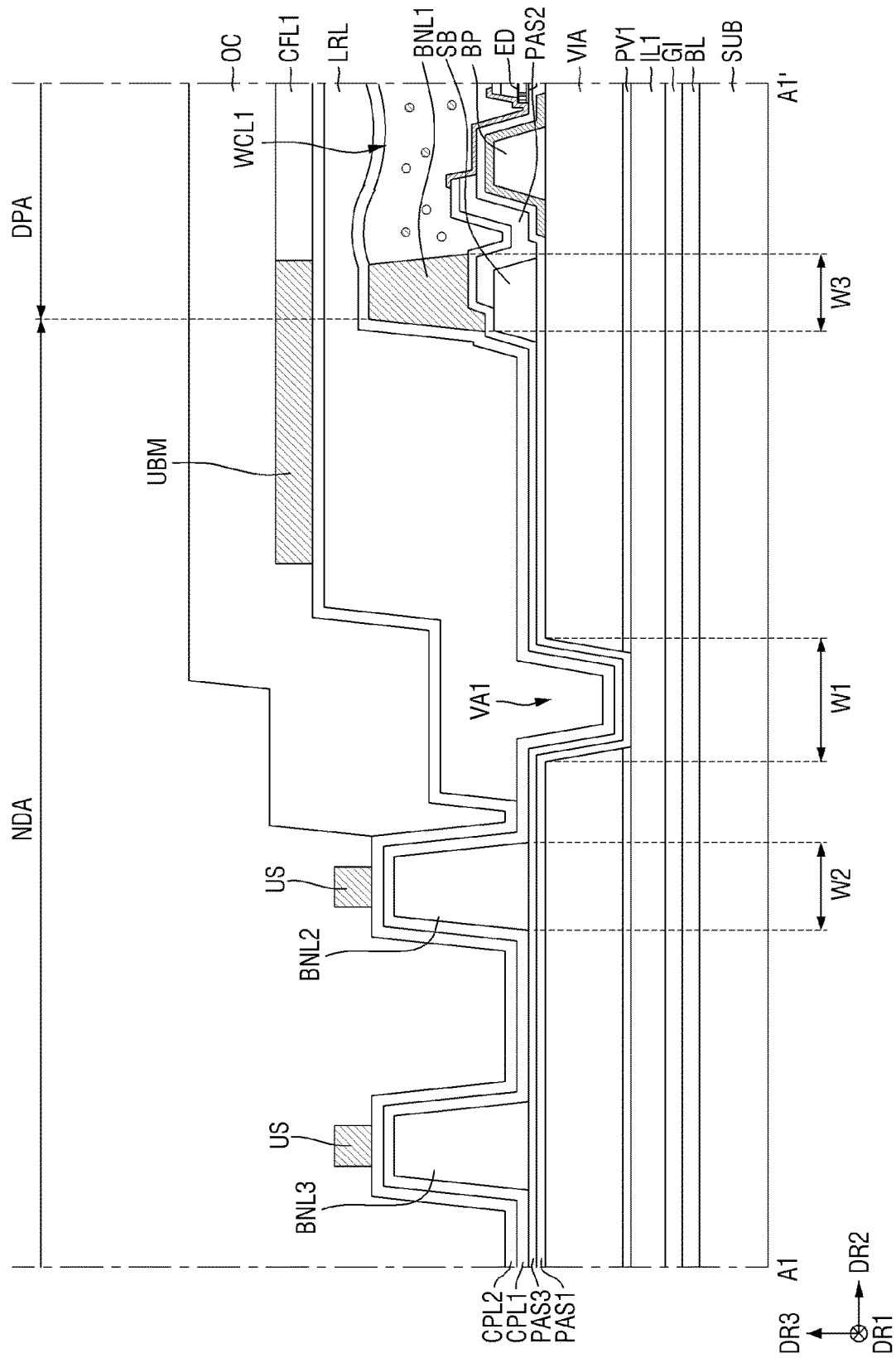
FIG. 10 is a schematic cross-sectional view taken along line A1-A1' of FIG. 2.

FIG. 10 is a schematic cross-sectional view taken along line A1-A1' of FIG. 2. FIG. 10 shows a cross section across a part of a sub-pixel SPXn located at the outermost part of the display area DPA and a part of the non-display area NDA.

Referring to FIG. 10 as well as FIG. 2, the first insulating layer PAS1 and the third insulating layer PAS3 arranged in the display area DPA may extend to the non-display area NDA over the sub-bank SB. The first insulating layer PAS1 may be disposed on (e.g., directly disposed on) the via layer VIA, and the third insulating layer PAS3 may be directly disposed on the first insulating layer PAS1 in the non-display area NDA. On the other hand, the second insulation layer PAS2 may not extend to the non-display area NDA. Although it is illustrated in the drawing that the second insulating layer PAS2 extends to the portion of the sub-bank SB located at the outermost part of the display area DPA, the disclosure is not limited thereto.

Further, as the encapsulation structure disposed on the color control structures WCL1, WCL2, and TPL, the first capping layer CPL1 and the second capping layer CPL2 may also extend to the non-display area NDA. A part of the first capping layer CPL1 may be disposed on (e.g., directly disposed on) the third insulating layer PAS3, and another part of the first capping layer CPL1 may be disposed on (e.g., directly disposed on) the first bank BNL1, the second bank BNL2 and the third bank BNL3. The second capping layer CPL2 may be disposed on the first capping layer CPL1 with the low refractive layer LRL interposed therebetween. The low refractive layer LRL may not extend in the non-display area NDA (e.g., entire non-display area NDA) unlike in the display area DPA, so that a part of the second capping layer CPL2 may be disposed on (e.g., directly disposed on) the first capping layer CPL1.

As described above, the low refractive layer LRL may be made of an organic material and may be disposed in the display area DPA (e.g., entire display area DPA). In the process of coating the organic material on the first capping layer CPL1, the organic material may overflow to the non-display area NDA over the first bank BNL1 located at the outermost part of the display area DPA. In an embodiment, the display device 10 may include a substrate SUB, and layers may be formed thereon by consecutive processes. In this process, the organic material undesirably overflowed to a region of the non-display area NDA may remain as foreign materials in a subsequent process, and a process of removing the foreign materials may not be easy. The display device 10 according to an embodiment may include the embossed and intaglio pattern-shaped structures arranged in the non-display area NDA, so that it may be possible to prevent the organic material overflowed to the non-display area NDA from further spreading to an undesired region.

The display device 10 may include the first valley VA1, the second bank BNL2, and the third bank BNL3 arranged in the non-display area NDA. The first valley VA1 may have an intaglio pattern shape depressed toward the bottom surface with respect to the top surface of the via layer VIA, and the second bank BNL2 and third bank BNL3 may have an embossed pattern shape protruding upward with respect to the top surface of the via layer VIA.

The first valley VA1 may be spaced apart from the first bank BNL1 while surrounding the display area DPA in plan view. The first valley VA1 may have a first width W1 and penetrate the first via layer VIA1 and the passivation layer PV1. A part of the top surface of the first interlayer insulating layer IL1 may be exposed at the first valley VA1, and some layers arranged on the via layer VIA may be arranged at the inner side of the first valley VA1. For example, the first insulating layer PAS1 disposed on (e.g., directly disposed on) the via layer VIA may be disposed at the inner side of the first valley VA1 and be in direct contact with the first interlayer insulating layer IL1, and may also be in direct contact with the inner sidewall of the first valley VA1 in the via layer VIA. In the non-display area NDA, the third insulating layer PAS3 disposed on (e.g., directly disposed on) the first insulating layer PAS1 and a part of the first capping layer CPL1 that may be disposed on (e.g., partially directly disposed on) the third insulating layer PAS3 may be disposed at the inner side of the first valley VA1. The first insulating layer PAS1, the third insulating layer PAS3, and the first capping layer CPL1 may include an inorganic insulating material, and may be arranged along the stepped portion formed by the first valley VIA in the via layer VIA. Since the inorganic insulating material such as the first insulating layer PAS1, the third insulating layer PAS3, and the first capping layer CPL1 may be arranged at the inner side of the first valley VA1, it may be possible to prevent external moisture from permeating the first interlayer insulating layer IL1 exposed by the first valley VA1.

The low refractive layer LRL may be disposed on the first capping layer CPL1 and may be partially disposed in the non-display area NDA over the first bank BNL1. The low refractive layer LRL may also be disposed on the first valley VA1 having an intaglio pattern shape while penetrating the via layer VIA, and may be partially disposed to fill the stepped portion formed by the first valley VA1. In the process of forming the low refractive layer LRL, the organic material forming the low refractive layer LRL may flow to the non-display area NDA over the display area DPA and fill the stepped portion formed by the first valley VA1. In other words, the first valley VA1 may prevent excessive overflow of the organic material. The low refractive layer LRL may fill the first valley VA1 and extend to the position spaced apart from the second bank BNL2.

Each of the first bank BNL1 and the second bank BNL2 may surround the first valley VA1 while being spaced apart therefrom. Further, the second bank BNL2 and the third bank BNL3 may be spaced apart from each other. In other words, the first valley VA1, the second bank BNL2, and the third bank BNL3 may be sequentially spaced apart from each other along a direction toward the outer part of the non-display area NDA with respect to the first bank BNL1. Unlike the first valley VA1, the second bank BNL2 and the third bank BNL3 may be arranged (e.g., directly arranged) on the third insulating layer PAS3 and have an upwardly protruding shape. Since the second bank BNL2 and the third bank BNL3 have an embossed pattern shape, it may be possible to prevent the low refractive layer LRL from overflowing to the outer part of the non-display area NDA.

In accordance with an embodiment, the second bank BNL2 and the third bank BNL3 may have the same width, and the first width W1 of the first valley VA1 may be greater than a second width W2 of the second bank BNL2 and the third bank BNL3 in cross-sectional view. The second bank BNL2 and the third bank BNL3 may be formed by the same process after the light emitting elements ED, the connection electrodes CNE, and the insulating layers PAS1, PAS2, and PAS3 may be formed in the display area DPA. The second bank BNL2 and the third bank BNL3 may have the same shape and the same material and may be different from each other only in the arrangement positions. In an embodiment, the width W2 in cross-sectional view may be the same.

The first valley VA1 may be a primary structure that may be disposed closer to the display area DPA than the second bank BNL2 and the third bank BNL3 and prevent overflow of the low refractive layer LRL. The first valley VA1 may have a width relatively greater than those of the second bank BNL2 and the third bank BNL3 to minimize overflow of the organic material of the low refractive layer LRL. The second bank BNL2 and the third bank BNL3 may have a width relatively smaller than that of the first valley VA1 and have an embossed pattern shape with a constant width, so that it may be possible to prevent the organic material from overflowing to the outermost part of the non-display area NDA over the first valley VA1.

On the other hand, the first bank BNL1 may be formed by the same process as the process of forming the second bank BNL2 and the third bank BNL3. The first bank BNL1 may also be disposed on (e.g., directly disposed on) the third insulating layer PAS3 while overlapping the sub-bank SB, and may be disposed in a grid pattern while surrounding the inner side of display area DPA at the outermost part of the display area DPA. However, in accordance with an embodiment, a third width W3 that may be the width of the first bank BNL1 in cross-sectional view may be smaller than the second width W2 of the second bank BNL2. The first bank BNL1 may form the space where color control structures TPL, WCL1, and WCL2 may be arranged while distinguishing adjacent sub-pixels SPXn in the display area DPA. The second bank BNL2 and the third bank BNL3 that may be structures for preventing overflow of the low refractive layer LRL may have different functions from that of the first bank BNL1. In other words, the first bank BNL1, the second bank BNL2, and the third bank BNL3 that may be arranged on (e.g., directly arranged on) the third insulating layer PAS3 may be formed by the same process, but the widths thereof may be different depending on functions. The second bank BNL2 and the third bank BNL3 that may be the structures for preventing overflow of the organic material and arranged in the non-display area NDA may have a width greater than that of the first bank BNL1.

The overcoat layer OC may be disposed to cover the color filter layer CFL and the upper light absorbing member UBM in the display area DPA, and may be partially disposed in the non-display area NDA. Similarly to the low refractive layer LRL, the overcoat layer OC may also be made of an organic material and may overflow on the color filter layer CFL and the second capping layer CPL2. The display device 10 according to an embodiment may further include, as a structure for preventing overflow of the overcoat layer OC, upper structures US disposed on the second bank BNL2 and the third bank BNL3.

Each of the upper structures US may be disposed on the second bank BNL2 and the third bank BNL3. Although not shown in the drawing, the planar shape of the upper structures US may be similar to that of the second bank BNL2 or the third bank BNL3. In other words, the upper structure US disposed on the second bank BNL2 may surround the display area DPA while being spaced apart from the first bank BNL1, and the upper structure US disposed on the third bank BNL3 may surround the upper structure US disposed on the second bank BNL2 while being spaced apart therefrom.

The upper structures US may prevent the overcoat layer OC disposed on the second capping layer CPL2 from overflowing in the non-display area NDA similarly to the second bank BNL2 and the third bank BNL3 that may prevent the low refractive layer LRL disposed below the second capping layer CPL2 from overflowing in the non-display area NDA. Each of the upper structures US may be disposed on (e.g., directly disposed on) the second capping layer CPL2 and may have a protruding embossed pattern with a constant thickness and a constant width. The overcoat layer OC covering the display area (e.g., entire display area DPA) may be prevented from overflowing to the non-display area NDA by the upper structure US.

In accordance with an embodiment, the upper structure US and the upper absorbing member UBM may be formed by the same process and may include the same material. The upper structure US and the upper absorbing member UBM that may be arranged on (e.g., directly arranged on) the second capping layer CPL2 may be formed by the same process. Since, however, the upper absorbing member UBM and the upper structure US may have different functions similarly to the banks BNL1, BNL2, and BNL3, the arrangement structures or the shapes thereof may be slightly different. The upper light absorbing member UBM may distinguish the light transmitting areas TA1, TA2, and TA3 and the light blocking area BA of the display device 10 and may be disposed in a grid pattern in the display area DPA. On the other hand, the upper structures US may be arranged to surround the inside of the non-display area NDA to prevent overflow of an organic material. Although the arrangement positions and the shapes of the upper structures US may be slightly different, they may be formed by the same process, which may be advantageous in that different members may be formed without addition of a fabricating process.

The display device 10 according to an embodiment may include embossed or intaglio pattern-shaped structures arranged in the non-display area NDA to surround the display area DPA. As the structures, the first valley VA1, the second bank BNL2, and the third bank BNL3 may prevent the organic material disposed in the display area DPA from overflowing in the non-display area NDA.

On the other hand, the display device 10 may include wires arranged in the display area DPA and extend in a direction. For example, the display device 10 may include the first voltage wire VL1 and the second voltage wire VL2 arranged in the display area DPA, and the first voltage wire VL1 and the second voltage wire VL2 may extend in the first direction DR1 to the non-display area NDA. In the display device 10, the wires may be arranged over the display area DPA and the non-display area NDA and may extend across the first valley VA1. Among the wires extending in a direction, the wires formed as the third conductive layer may not extend over the first valley VA1, and thus may be connected while bypassing the first valley VA1 through a wire disposed in another layer.

Figure 11:
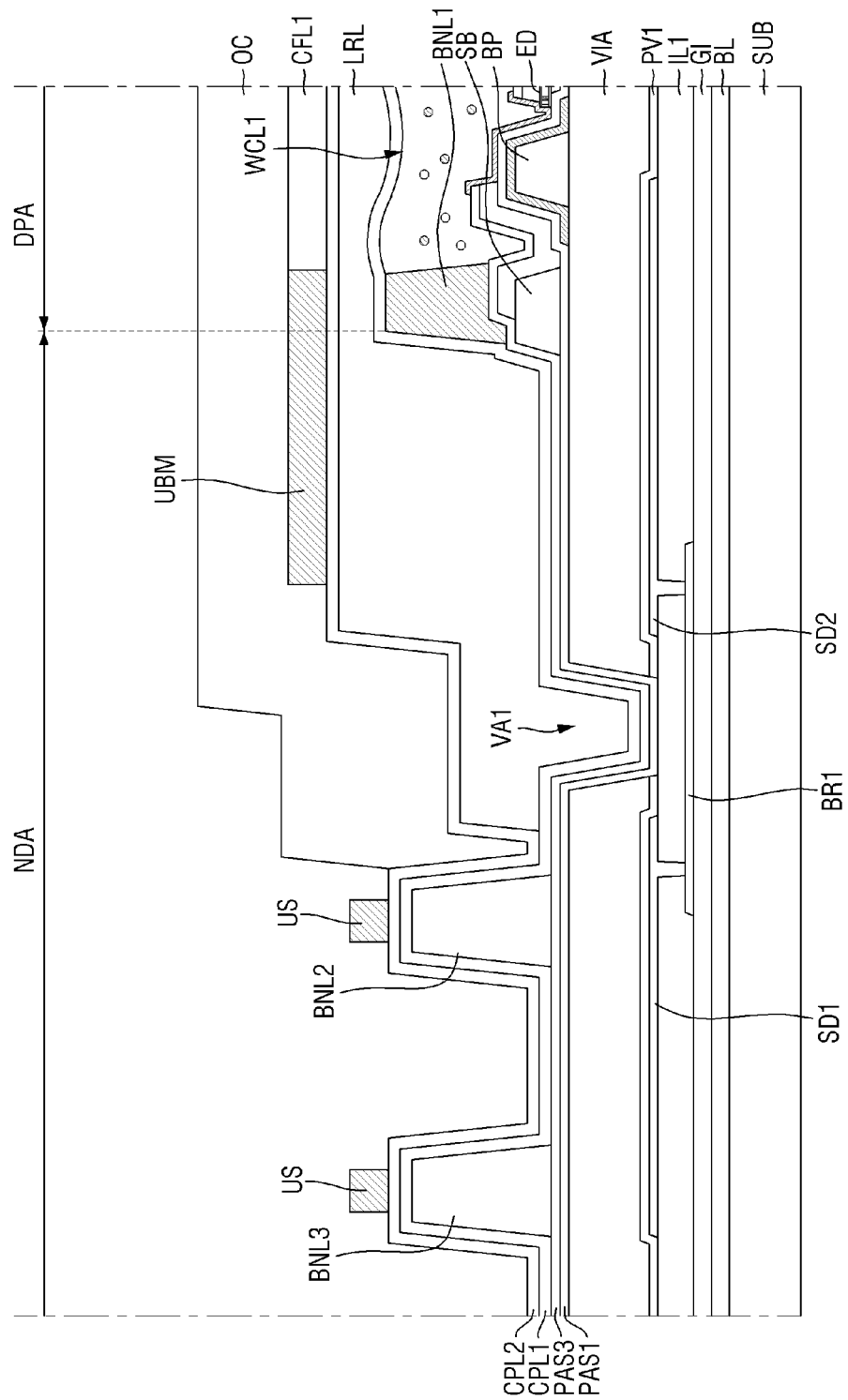
FIG. 11 is a schematic diagram showing a cross section across a boundary between a display area and a non-display area of a display device according to another embodiment.

FIG. 11 is a schematic diagram showing a cross section across a boundary between a display area and a non-display area of a display device according to another embodiment. FIG. 11 shows a cross section across a part of a sub-pixel SPXn located at the outermost part of the display area DPA and a part of the non-display area NDA, and illustrates wires SD1 and SD2 bypassing the first valley VA1.

Referring to FIG. 11 as well as FIG. 2, the display device 10 according to an embodiment may include the first wire SD1 and the second wire SD2 formed as the third conductive layer, and a first bridge wire BR1 connected to each of the first wire SD1 and the second wire SD2 and formed as a conductive layer disposed below the third conductive layer. The first wire SD1 and the second wire SD2 that may be formed as the third conductive layer and extend in the first direction DR1 may be electrically connected to each other and applied with the same signal. In one example, the first wire SD1 and the second wire SD2 may be part of the first voltage wire VL1 or the second voltage wire VL2 applied with a power voltage. The first wire SD1 and the second wire SD2 extending in the first direction DR1 may be spaced apart from each other with respect to the first valley VA1.

In case that the first wire SD1 and the second wire SD2 may be connected to (e.g., directly connected to) each other on the first interlayer insulating layer ILL the top surfaces of the first wire SD1 and the second wire SD2 may be partially exposed by the first valley VA1. The first wire SD1 and the second wire SD2 may be damaged in a subsequent process. Therefore, the first wire SD1 and the second wire SD2 may be connected by bypassing through another conductive layer.

The first bridge wire BR1 that may be the conductive layer below the third conductive layer may be formed as the first conductive layer or the second conductive layer. For example, in case that the first bridge wire BR1 is formed as the second conductive layer, each of the first wire SD1 and the second wire SD2 may be connected to the first bridge wire BR1 through the contact hole penetrating the first interlayer insulating layer ILL In case that the first wire SD1 and the second wire SD2 extending in a direction are connected by the first bridge wire BR1, the first bridge wire BR1 also extends in a direction and may overlap the first valley VA1 in the thickness direction. The first bridge wire BR1 may be disposed below the first interlayer insulating layer IL1, and thus may extend across the first valley VA1 in plan view. The display device 10 may include the first valley VA1 for preventing overflow of the organic material of the layers arranged on the via layer VIA, and may include the wires SD1 and SD2 bypassing the first valley VA1 and the bridge wire BR1 below the via layer VIA.

On the other hand, although the cross section at one side in the second direction DR2 of the display area DPA in the non-display area NDA illustrates the structure in which the first wire SD1 and the second wire SD2 bypass through the first bridge wire BR1, the disclosure is not limited thereto. The display device 10 may include wires arranged over the display area DPA and the non-display area NDA located on both sides in the first direction DR1 of the display area DPA, and these wires may be connected to each other through a bridge wire formed as another conductive layer similarly to the case shown in FIG. 11.

Figure 12:
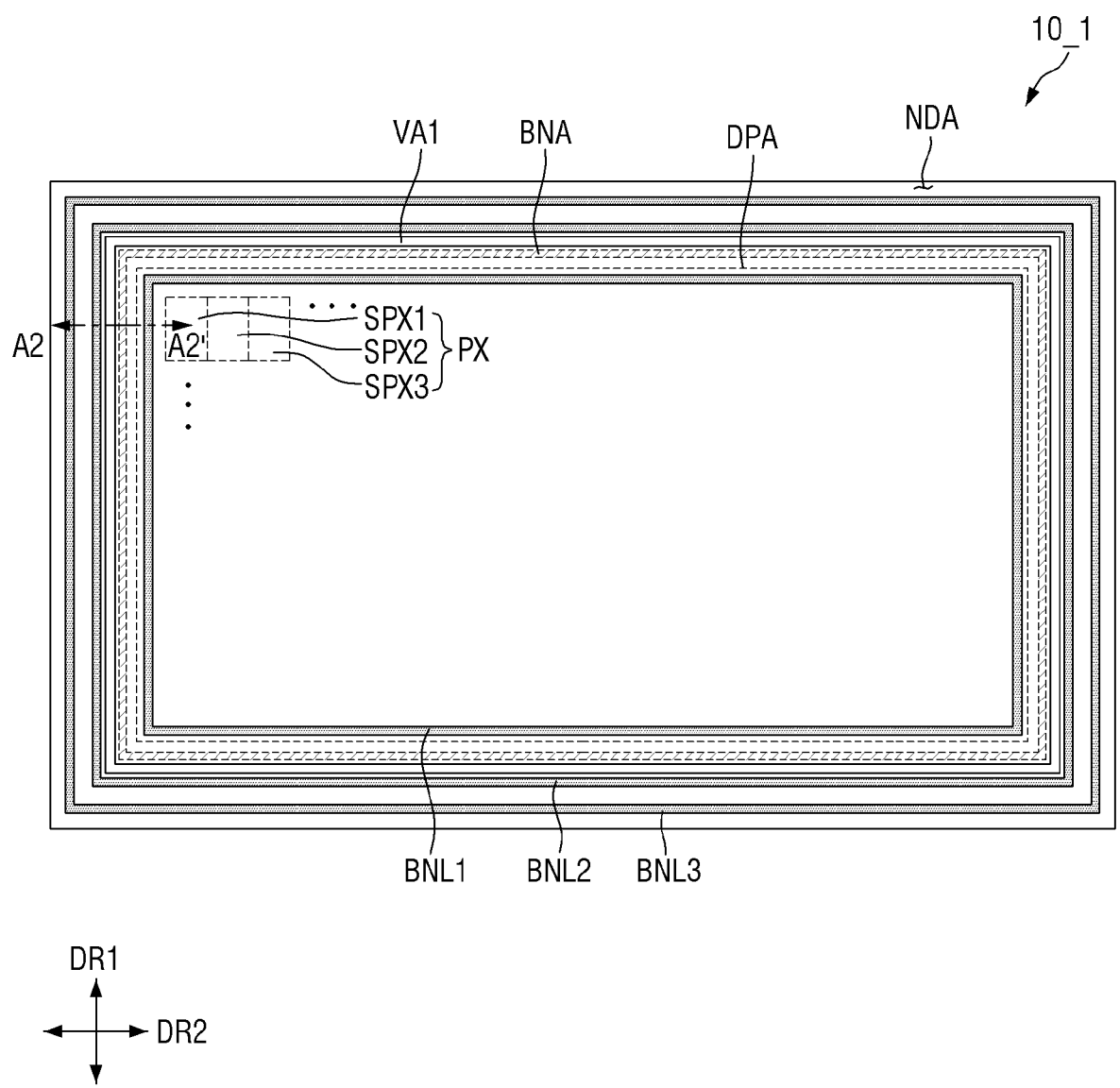
FIG. 12 is a schematic diagram illustrating a display area and a non-display area of a display device according to another embodiment.
Figure 13:
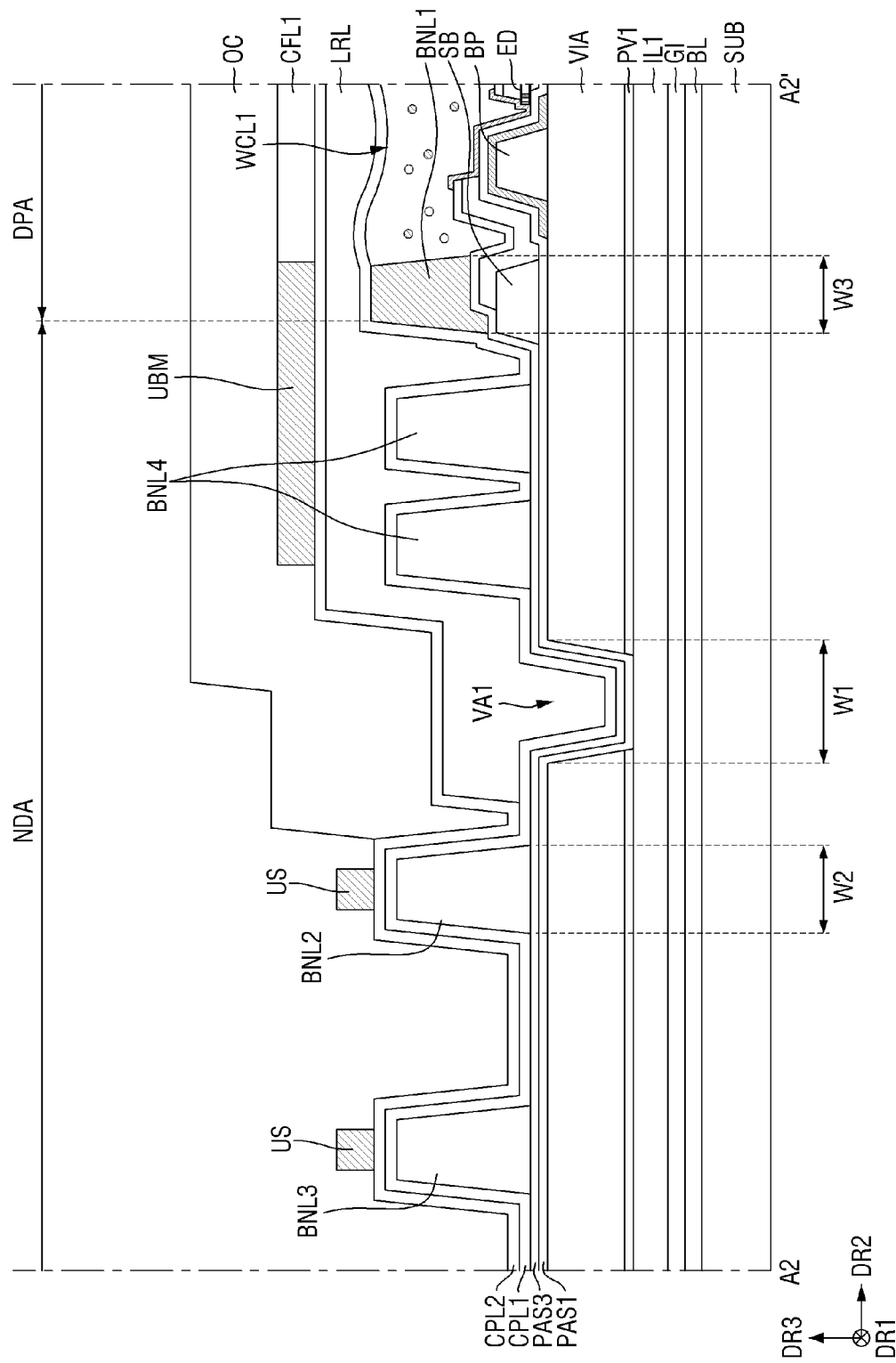
FIG. 13 is a schematic cross-sectional view taken along line A2-A2' in FIG. 12.

FIG. 12 is a schematic diagram illustrating a display area and a non-display area of a display device according to another embodiment. FIG. 13 is a schematic cross-sectional view taken along line A2-A2' in FIG. 12. FIG. 13 shows a cross section across a part of a sub-pixel SPXn located at the outermost part of the display area DPA and a part of the non-display area NDA.

Referring to FIGS. 12 and 13, a display device 10_1 according to an embodiment may further include a bank pattern area BNA disposed between the first valley VA1 and the first bank BNL1 in the non-display area NDA. The structures forming an embossed pattern may be arranged in the bank pattern area BNA to prevent overflow of the organic material of the low refractive layer BNL3 together with the first valley VA1, the second bank BNL2, and the third bank BNL3. An embodiment may be different from embodiments of FIGS. 2 and 10 in that it further includes the bank pattern area BNA disposed in the non-display area NDA. In the following description, a redundant description will be omitted and differences will be described.

The bank pattern area BNA may be defined as an area where structures may be arranged between the first bank BNL1 and the first valley VA1. The first valley VA1 may be disposed closer to the second bank BNL2 than the first bank BNL1, and it may be possible to more effectively prevent overflow of the organic material by further providing other structures therebetween.

In accordance with an embodiment, embossed or intaglio pattern-shaped structures may be arranged in the bank pattern area BNA. A maximum number of structures may be arranged in the region between the first bank BNL1 and the first valley VA1 to form the bank pattern area BNA. For example, fourth banks BNL4 spaced apart from each other may be arranged between the first bank BNL1 and the first valley VA1.

The fourth banks BNL4 and the second bank BNL2 may be formed by the same process. In other words, the fourth banks BNL4 may be disposed on (e.g., directly disposed on) the third insulating layer PAS3, and the first capping layer CPL1 may be disposed on (e.g., directly disposed on) the fourth banks BNL4. The fourth banks BNL4 may be arranged in the non-display area NDA between the first bank BNL1 and the first valley VA1 and may be arranged below the upper light absorbing member UBM. The fourth banks BNL4 may have an embossed pattern shape protruding upward on the via layer VIA, and may prevent overflow of the organic material of the low refractive layer LRL together with the first valley VA1.

Although not shown in the drawing, the planar shape of the fourth banks BNL4 may be the same as that of the second bank BNL2. The fourth bank BNL4 disposed at the inner side of the non-display area NDA may surround the display area DPA while being spaced apart from the first bank BNL1, and another fourth bank BNL4 may be disposed to surround the adjacent fourth bank BNL4 disposed at the inner side. Although FIG. 13 illustrates that two fourth banks BNL4 may be adjacent to each other, the disclosure is not limited thereto. In an embodiment, unlike the second bank BNL2, the third bank BNL3, or the first valley VA1, the fourth bank BNL4 disposed in the bank pattern area BNA may not necessarily surround another bank disposed at the inner side or the display area DPA. In accordance with an embodiment, the fourth banks BNL4 arranged in the bank pattern area BNA may form patterns having a specific shape and spaced apart from each other.

Figure 14:
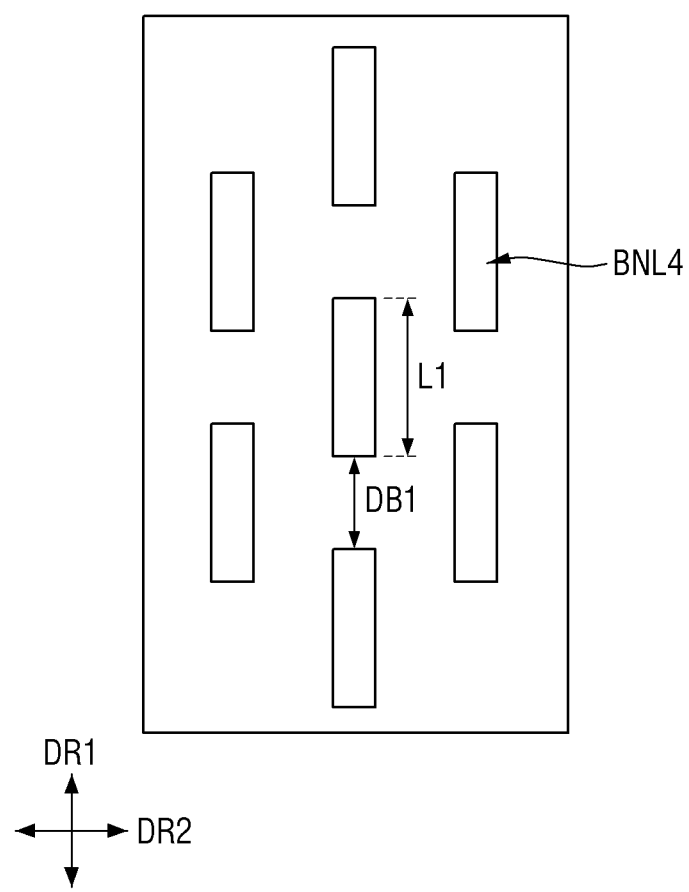
FIG. 14 is a schematic diagram showing the planar arrangement of the fourth banks arranged in the bank pattern area of the display device of FIG. 12.
Figure 15:
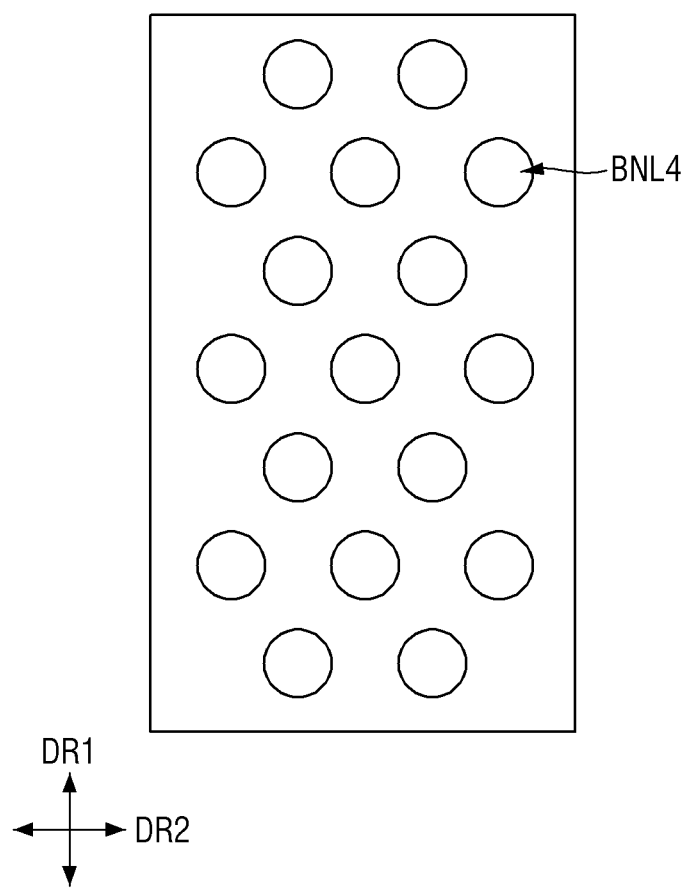
FIG. 15 is a schematic diagram showing the planar arrangement of the fourth banks arranged in the bank pattern area of a display device according to another embodiment.

FIG. 14 is a schematic diagram showing the planar arrangement of the fourth banks arranged in the bank pattern area of the display device of FIG. 12. FIG. 15 is a schematic diagram showing the planar arrangement of the fourth banks arranged in the bank pattern area of a display device according to another embodiment.

Referring to FIGS. 14 and 15, the fourth banks BNL4 of the display device 10_1 may form repetitively arranged patterns spaced apart from each other in various directions without surrounding the inner region. The fourth bank BNL4 in FIG. 14 may a shape extending in the first direction DR1 in plan view, and the fourth banks BNL4 may be spaced apart from another fourth bank BNL4 in the direction DR1 and in a diagonal direction between the first direction DR1 and the second direction DR2. The fourth bank BNL4 in FIG. 15 may have a circular shape in plan view, and may be spaced apart from another fourth bank BNL4 in the first direction DR1 and in a diagonal direction.

On the other hand, the pattern size of the fourth bank BNL4 may be greater than the gap between the fourth banks BNL4 in order to obtain the effect of preventing overflow of the organic material. In an example, in an embodiment in which the fourth bank BNL4 has a shape extending in a direction, a first length L1 measured in the extension direction of the fourth bank BNL4 may be greater than a first gap DB1 between the fourth banks BNL4 spaced apart from each other in the extension direction. If the first gap DB1 is greater than the first length L1 of the fourth bank BNL4, the organic materials may easily flow through the gap between the fourth banks BNL4. In order to prevent this, the first length L1 may be greater than the gap between the fourth banks BNL4.

Figure 16:
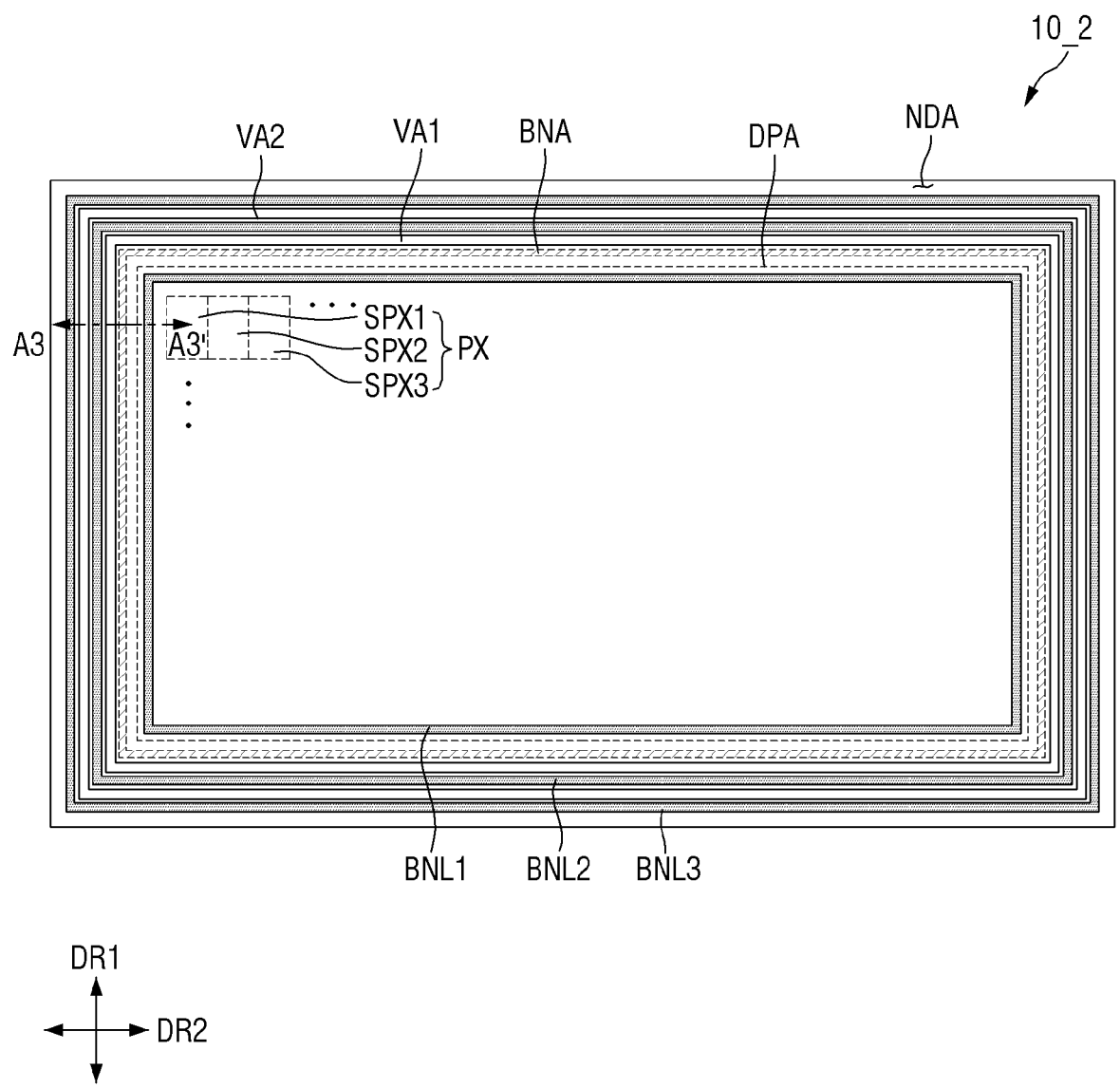
FIG. 16 is a schematic diagram illustrating a display area and a non-display area of a display device according to still another embodiment.
Figure 17:
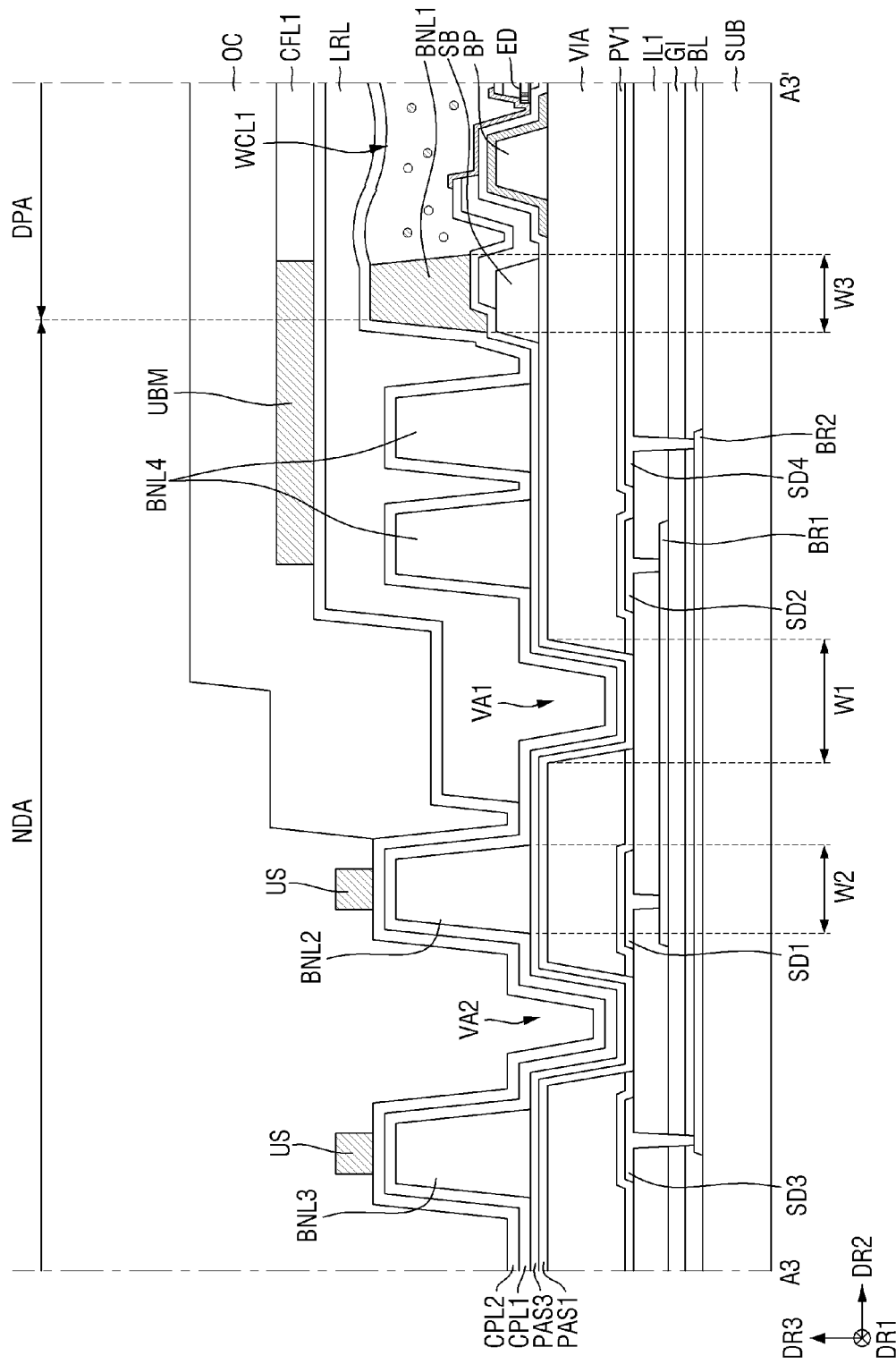
FIG. 17 is a schematic cross-sectional view taken along line A3-A3' in FIG. 16.

FIG. 16 is a schematic diagram illustrating a display area and a non-display area of a display device according to still another embodiment. FIG. 17 is a schematic cross-sectional view taken along line A3-A3' in FIG. 16. FIG. 17 shows a cross section across a part of a sub-pixel SPXn located at the outermost part of the display area DPA and a part of the non-display area NDA, and illustrates wires SD1, SD2, SD3, and SD4 bypassing the first valley VA1 and a second valley VA2.

Referring to FIGS. 16 and 17, a display device 10_2 according to an embodiment may further include the second valley VA2 disposed between the second bank BNL2 and the first bank BNL1 in the non-display area NDA. Since the display device 10_2 may further include the second valley VA2 having the same intaglio pattern shape as that of the first valley VA1 between the second bank BNL2 and the third bank BNL3, it may be possible to more effectively prevent overflow of the organic material of the low refractive layer LRL. An embodiment may be different from embodiments of FIGS. 11 and 13 in that a larger number of wires SD1, SD2, SD3, and SD4 may be arranged to bypass the valleys VA1 and VA2 due to the presence of the second valley VA2. In the following description, a redundant description will be omitted and differences will be described.

The second valley VA2 may have the same shape as that of the first valley VA1 although they may be located at different positions. The second valley VA2 may penetrate the via layer VIA and the passivation layer PV1 to expose a part of the top surface of the first interlayer insulating layer IL1. The first insulating layer PAS1, the third insulating layer PAS3, the first capping layer CPL1, and the second capping layer CPL2 may be arranged at the inner side of the second valley VA2 along the stepped portion formed by the second valley VA2. The second valley VA2 may be disposed to surround the second bank BNL2 in plan view, and may be disposed between the second bank BNL2 and the third bank BNL3 while being spaced apart therefrom.

Since the display device 10_2 further includes the second valley VA2, the wires arranged at the outer side of the second valley VA2, between the first valley VA1 and the second valley VA2, and at the inner side of the first valley VA1 in the non-display area NDA may be connected to each other while bypassing the valleys VA1 and VA2. For example, as in an embodiment of FIG. 11, the first wire SD1 and the second wire SD2 may be connected while bypassing the first valley VA1 through the first bridge wire BR1 formed of the second conductive layer. The first wire SD1 may be disposed between the first valley VA1 and the second valley VA2, and the second wire SD2 may be disposed at the inner side of the first valley VA1 and connected to another wire disposed in the display area DPA.

Similarly, the third wire SD3 disposed at the outer side of the second valley VA2 and the fourth wire SD4 disposed at the inner side of the first valley VA1 may be connected to each other through a second bridge wire BR2 formed of the first conductive layer. Each of the third wire SD3 and the fourth wire SD4 may be in contact with the second bridge wire BR2 through the contact hole penetrating the first interlayer insulating layer IL1, the first gate insulating layer GI, and the buffer layer BL. The second bridge wire BR2 may have a shape extending in a direction and overlap the first valley VA1 and the second valley VA2 in the thickness direction. The third wire SD3 and the fourth wire SD4 may be connected to each other while bypassing the first valley VA1 and the second valley VA2 through the bridge wire disposed in the conductive layer below the first interlayer insulating layer IL1.

Figure 18:
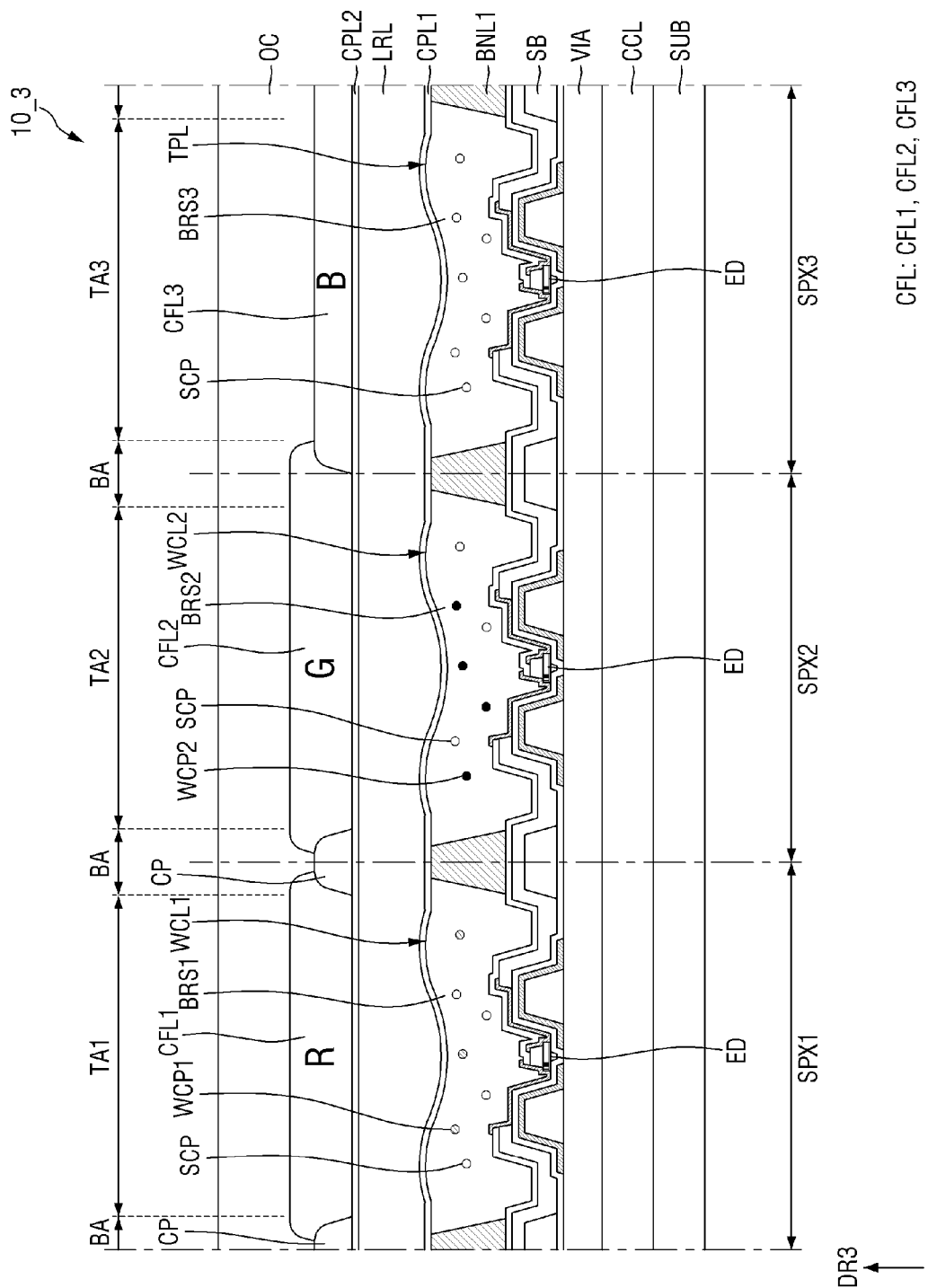
FIG. 18 is a schematic cross-sectional view showing color control structures and a color filter layer arranged in a pixel of a display device according to another embodiment.
Figure 19:
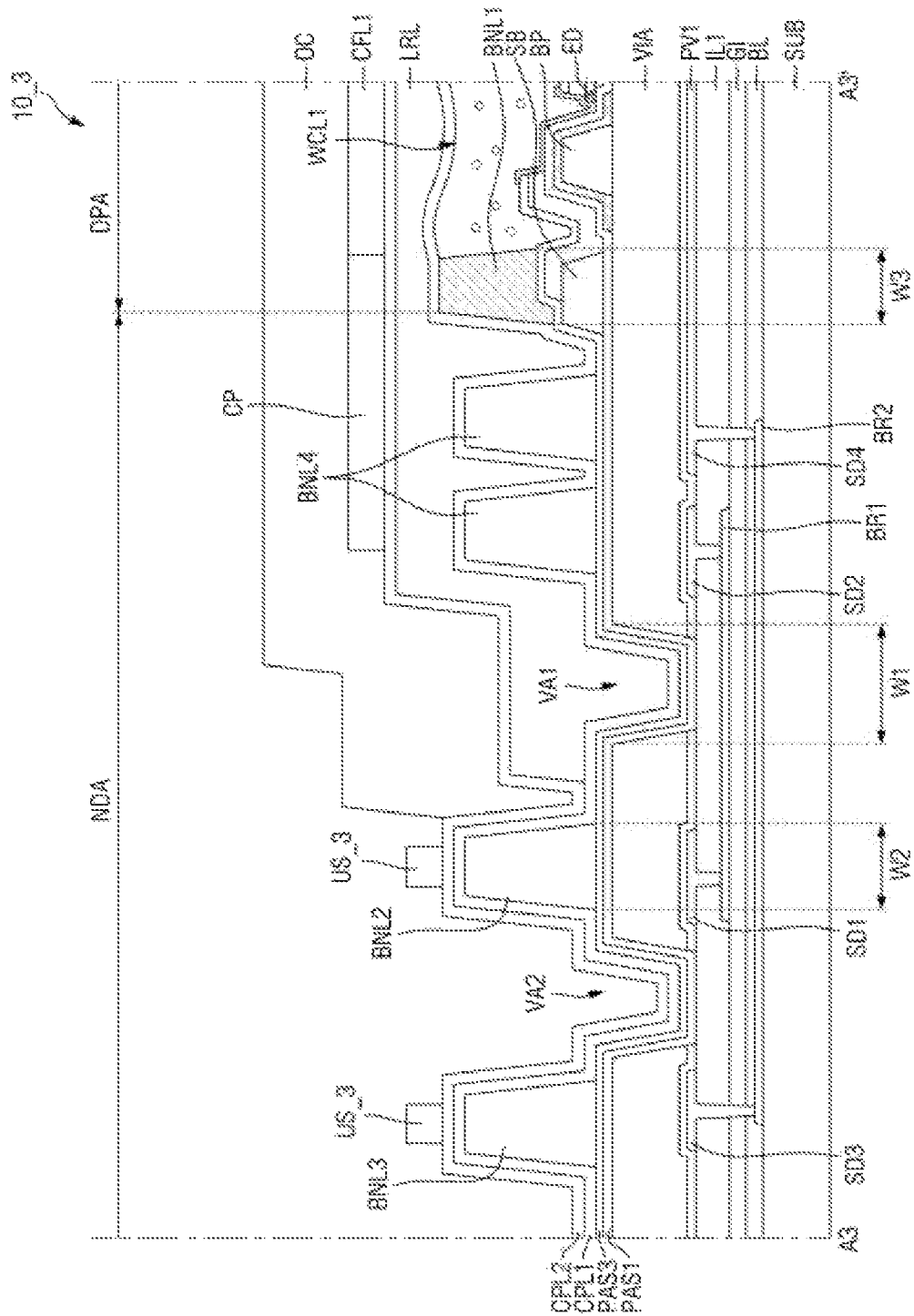
FIG. 19 is a schematic diagram showing a cross section across a boundary between a display area and a non-display area of the display device of FIG. 18.

FIG. 18 is a schematic cross-sectional view showing color control structures and a color filter layer arranged in a pixel of a display device according to another embodiment. FIG. 19 is a schematic diagram showing a cross section across a boundary between a display area and a non-display area of the display device of FIG. 18.

Referring to FIGS. 18 and 19, in a display device 10_3 according to an embodiment, the upper light absorbing member UBM may be omitted and the color pattern CP may be disposed. An embodiment may be different from an embodiment of FIG. 17 in that the upper light absorbing member UBM may be replaced with the color pattern CP.

The color pattern CP may be formed in a grid pattern that may be substantially the same as that of the upper light absorbing member UBM of FIG. 17. However, the color pattern CP and the third color filter layer CFL3 may be made of a same material and may formed integrally with each other. The material of the third color filter layer CFL3 may be formed with a substantially larger width on the second capping layer CPL2 in the light blocking area BA of the third sub-pixel SPX3.

At least one of the first color filter layer CFL1 and the second color filter layer CFL2 may be partially disposed on the color pattern CP in the light blocking area BA adjacent to the first light transmitting area TA1 of the first sub-pixel SPX1 and the second light transmitting area TA2 of the second sub-pixel SPX2. Each of the first color filter layer CFL1 and the second color filter layer CFL2 may include a dye of a color different from that of the third color filter layer CFL3, so that the transmission of the light may be blocked at the portion where they may be stacked on each other. Further, in an embodiment in which the third color filter layer CFL3 includes a blue colorant, the external light or the reflected light that has transmitted through the light transmitting area BA may have a blue wavelength band. The eye color sensibility perceived by user's eyes varies depending on the color of the light. The light in the blue wavelength band may be perceived less sensitively to a user than the light in the green wavelength band and the light in the red wavelength band. Since the upper light absorbing member UBM may be omitted and the color pattern CP may be disposed in the light blocking area BA, the transmission of the light may be blocked and the user may perceive the reflected light relatively less sensitively. Also, it may be possible to absorb a part of the light from the outside of the display device 10_3 and reduce the reflected light due to the external light.

Upper structures US_3 disposed on the second bank BNL2 and the third bank BNL3 of the non-display area NDA may include the same material as that of the color pattern CP. The upper structure US_3 may be formed by the same process as the process of forming the color pattern CP, and may include the same material as that of the third color filter layer CFL3. The upper structure US_3 that prevents overflow of the overcoat layer OC may be made of other materials as long as the structural features may be maintained. Since the display device 10_3 of an embodiment may include the color pattern CP disposed in the light blocking area BA, the material of the upper structure US_3 may be different from that in an embodiment of FIG. 18.

Figure 20:
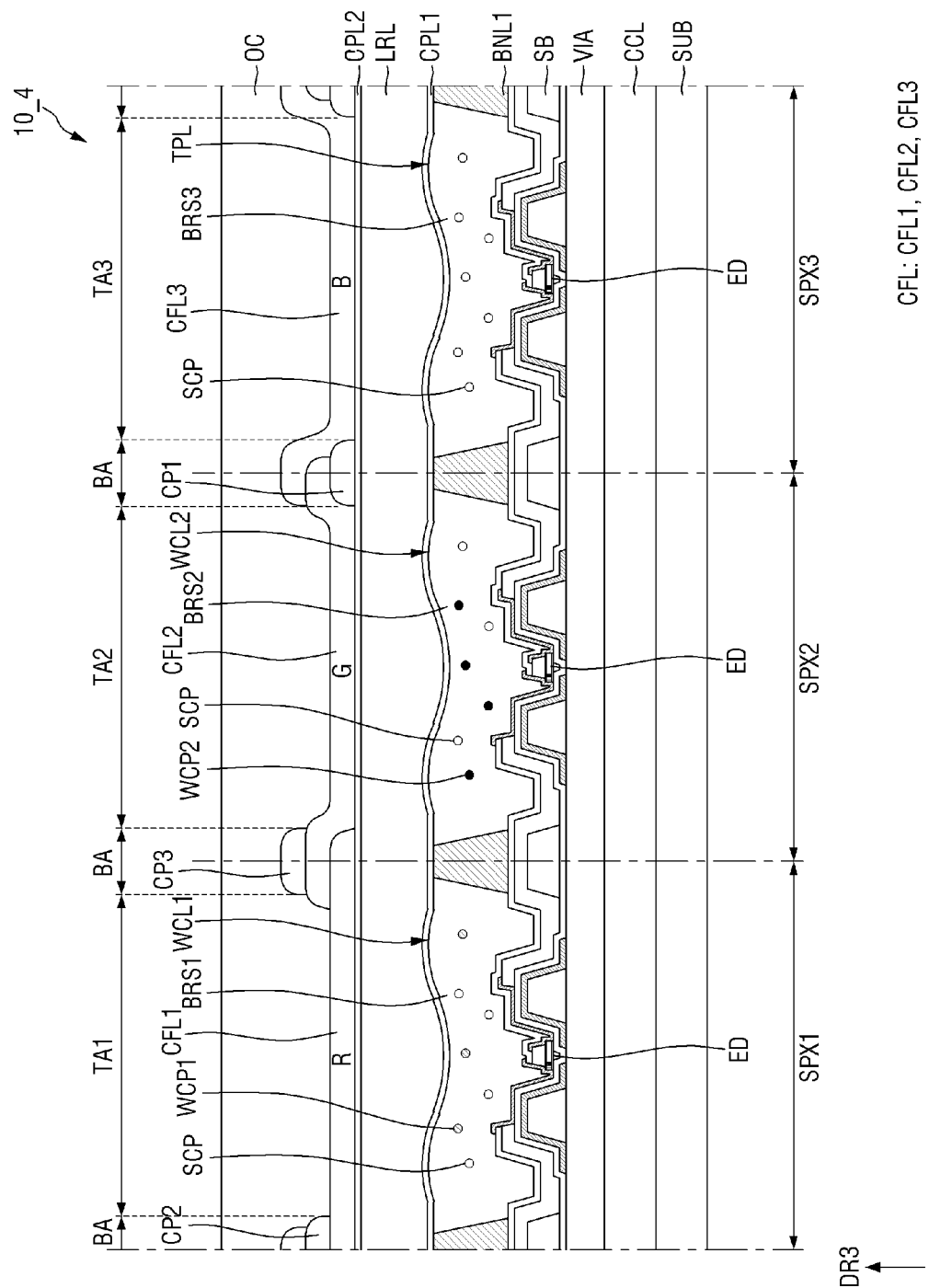
FIG. 20 is a schematic cross-sectional view showing color control structures and a color filter layer arranged in a pixel of a display device according to another embodiment.

FIG. 20 is a schematic cross-sectional view showing color control structures and a color filter layer arranged in a pixel of a display device according to another embodiment.

Referring to FIG. 20, in a display device 10_4 according to an embodiment, a color pattern CP may be replaced with multiple color patterns CP1, CP2, and CP3. An embodiment may be different from an embodiment shown in FIG. 18 in that the color patterns CP1, CP2, and CP3 made of the same material as those of the first to third color filter layers CFL1, CFL2, and CFL3 may be stacked on each other.

The first color pattern CP1 may be made of the same material as that of the first color filter layer CFL1 and disposed in the light blocking area BA. The first color pattern CP1 may be disposed on (e.g., directly disposed on) the second capping layer CPL2 in the light blocking area BA, and may be integrated with the first color filter layer CFL1 in the light blocking area BA adjacent to the first light transmitting area TA1 of the first sub-pixel SPX1.

The second color pattern CP2 may be made of the same material as that of the second color filter layer CFL2 and disposed in the light blocking area BA. The second color pattern CP2 may be disposed on (e.g., directly disposed on) the second color pattern CP2 in the light blocking area BA, and may be integrated with the second color filter layer CFL2 in the light blocking area BA adjacent to the second light transmitting area TA2 of the second sub-pixel SPX2. Similarly, the third color pattern CP3 may be made of the same material as that of the third color filter layer CFL3 and disposed in the light blocking area BA. The third color pattern CP3 may be disposed on (e.g., directly disposed on) the second color pattern CP2 in the light blocking area BA, and may be integrated with the third color filter layer CFL3 in the light blocking area BA adjacent to the third light transmitting area TA3 of the third sub-pixel SPX3.

The display device 10_4 according to an embodiment may have a structure in which the color patterns CP1, CP2, and CP3 may be stacked on each other and perform the same function as that of the upper light absorbing member UBM of FIG. 18. Therefore, it may be possible to prevent color mixture between adjacent areas due to the materials including different colorants.

Figure 21:
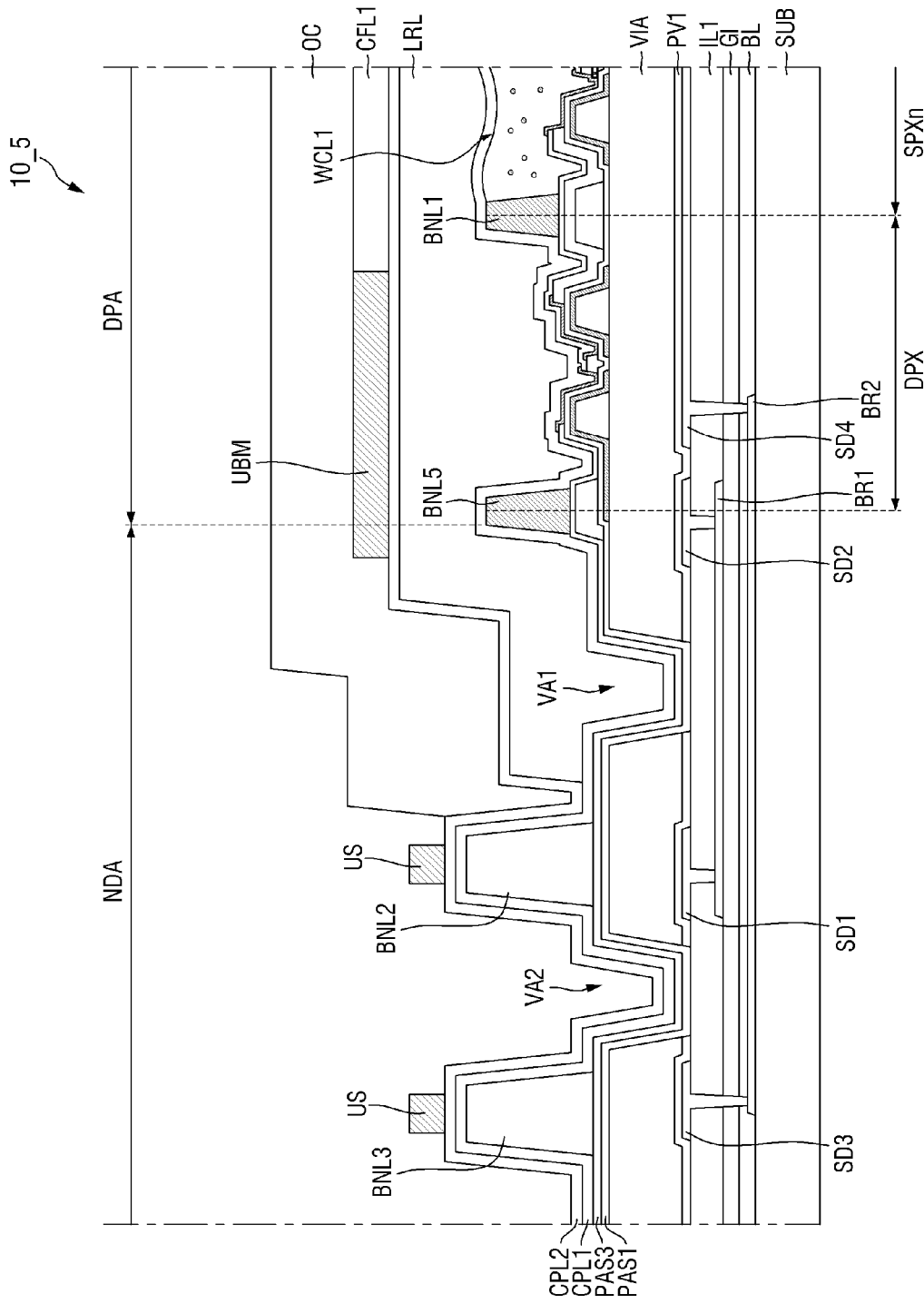
FIG. 21 is a schematic diagram showing a cross section across a boundary between a display area and a non-display area of a display device according to another embodiment.

FIG. 21 is a schematic diagram showing a cross section across a boundary between a display area and a non-display area of a display device according to another embodiment.

Referring to FIG. 21, a display device 10_5 according to an embodiment may further include dummy pixels DPX located at the outermost part of the display area DPA, and a fifth bank BNL5 disposed at the boundary between the dummy pixel DPX and the sub-pixel SPXn and the boundary between the display area DPA and the non-display area NDA.

The dummy pixel DPX may have substantially the same structure as that of the sub-pixel SPXn of the display area DPA. Since, however, no light emitting element ED may be disposed on the electrodes RME in the dummy pixel DPX, the dummy pixel DPX may be a pixel where no light may be emitted even in case that an electric signal may be applied. Although the dummy pixel DPX may be disposed in the display area DPA in terms of area division, no light may be emitted in the dummy pixel DPX. Therefore, the dummy pixel DPX may be disposed below the upper light absorbing member UBM. During the fabricating process of the display device 10_5, a patterning process performed in the display area DPA may need to be uniformly performed so that the sub-pixels SPXn may have the same structure regardless of positions. Since, however, the outermost part of the display area DPA may be located at the boundary between the area where the patterning process may be performed and the area where the patterning process may not be performed, a fabrication error may occur more in the outermost part of the display area DPA than in the inner side of the display area DPA. Since the variation between pixels may occur in the sub-pixels SPXn located at the outermost part of the display area DPA due to the error of the patterning process, the dummy pixels DPX where no light emitting element ED may be disposed may be arranged at the outermost part of the display area DPA.

Similarly to the sub-pixels SPXn arranged at the inner side, the protruding pattern BP, the electrode RME, the insulating layers PAS1, PAS2 and PAS3, and the connection electrodes CNE may be arranged in the dummy pixel DPX, except for the light emitting elements ED. Further, the second insulating layer PAS2 disposed in the dummy pixel DPX may have a pattern shape different from those of the sub-pixels SPXn arranged at the inner side. In the second insulating layer PAS2, some patterns may be arranged on the protruding pattern BP and the sub-bank SB at the inner side with respect to the center of the dummy pixel DPX. However, the pattern may not remain at the outer side with respect to the center of the dummy pixel DPX. On the other hand, the first insulating layer PAS1 and the third insulating layer PAS3 may extend from the display area DPA to the non-display area NDA.

Further, the color control structures TPL, WCL1, and WCL2 and the color filter layer CFL may not be arranged on the dummy pixel DPX. Since no light emitting element ED may be disposed in the dummy pixel DPX, the color control structures TPL, WCL1, and WCL2 and the color filter layer CFL that convert the wavelength of light may not be arranged on the dummy pixel DPX and may be replaced with the upper light absorbing member UBM.

On the other hand, the first bank BNL1 may be disposed at the boundary between the dummy pixel DPX and the sub-pixel SPXn, and the dummy pixels DPX and the fifth bank BNL5 surrounding the inner region thereof may be arranged at the outermost part of the display area DPA. The fifth bank BNL5 may be disposed at the boundary with the non-display area NDA while surrounding the display area DPA to prevent the low refractive layer LRL of the encapsulation structure from overflowing in the non-display area NDA. The fifth bank BNL5 may be formed by the same process as the process of forming the first bank BNL1 disposed at the boundaries of the sub-pixels SPXn. However, unlike the first bank BNL1, the fifth bank BNL5 may prevent overflow of an organic material similarly to the second bank BNL2. In an embodiment, the dummy pixel DPX disposed between the first bank BNL1 located at the outer side of the sub-pixel SPXn and the first valley VA1 and the fifth bank BNL5 located at the outer side of the display area DPA may be further provided, so that it may be possible to improve the uniformity between the sub-pixels SPXn in the patterning process and utilize the fifth bank BNL5 disposed in the dummy pixel DPX as the structure for preventing overflow of an organic material.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:
1. A display device comprising:
   a substrate including a display area and a non-display area adjacent to the display area;
   a passivation layer disposed on the substrate;
   a via layer disposed on the passivation layer;
   sub-pixels each including electrodes disposed on the via layer and light emitting elements disposed on the electrodes in the display area;
   a first bank disposed on the via layer and surrounding the sub-pixels in the display area;
   a second bank disposed on the via layer and spaced apart from the first bank in the non-display area;
   a third bank disposed on the via layer and spaced apart from the second bank in the non-display area; and
   a first valley disposed between the first bank and the second bank in the non-display area and penetrating the via layer and the passivation layer, wherein
   all portions of the first bank are disposed farther from the substrate in a thickness direction of the display device than all portions of the light emitting elements.
2. The display device of claim 1, further comprising:
   dummy pixels surrounding the sub-pixels disposed at an outermost part of the display area, the electrodes being disposed on the dummy pixels; and
   a fifth bank surrounding the dummy pixels at a boundary between the display area and the non-display area.
3. The display device of claim 1, further comprising:
   a first interlayer insulating layer disposed between the substrate and the passivation layer;
   a first wire disposed between the first interlayer insulating layer and the passivation layer at an outer side of the first valley;
   a second wire disposed between the first interlayer insulating layer and the passivation layer at an inner side of the first valley; and
   a first bridge wire disposed between the first interlayer insulating layer and the substrate and overlapping the first valley in a thickness direction,
   wherein each of the first wire and the second wire contacts the first wire and the second wire through a contact hole penetrating the first interlayer insulating layer.
4. The display device of claim 1, further comprising color control structures disposed on the light emitting elements and formed subsequent to the light emitting elements, wherein the first bank surrounds ones of the color control structures and distinguishes neighboring ones of the color control structures disposed in different ones of the sub-pixels.

5. The display device of claim 1, further comprising a first insulating layer disposed on the substrate and in the display area and the non-display area, wherein
the first insulating layer covers the first electrode and the second electrode,
the first insulating layer is disposed between the first bank and the substrate in a thickness direction of the display device, and
the second bank is disposed between the first bank and the third bank.

6. A display device comprising:
a substrate including a display area and a non-display area adjacent to the display area;
a passivation layer disposed on the substrate;
a via layer disposed on the passivation layer;
sub-pixels each including electrodes disposed on the via layer and light emitting elements disposed on the electrodes in the display area;
a first bank disposed on the via layer and surrounding the sub-pixels in the display area;
a second bank disposed on the via layer and spaced apart from the first bank in the non-display area;
a third bank disposed on the via layer and spaced apart from the second bank in the non-display area;
a first valley disposed between the first bank and the second bank in the non-display area and penetrating the via layer and the passivation layer;
a first insulating layer disposed on the electrodes;
a second insulating layer disposed on the light emitting elements; and
a third insulating layer disposed on the first insulating layer and the second insulating layer, wherein
the first insulating layer and the third insulating layer are disposed on the display area and the non-display area, and
each of the first bank, the second bank, and the third bank is disposed on the third insulating layer.

7. The display device of claim 6, further comprising a first interlayer insulating layer disposed between the substrate and the passivation layer, wherein
a portion of each of the first insulating layer and the third insulating layer is disposed in the first valley,
the first insulating layer contacts the first interlayer insulating layer exposed by the first valley, and
the third insulating layer is disposed on the first insulating layer in the non-display area.

8. The display device of claim 6, wherein each of the sub-pixels further includes:
a first connection electrode disposed on the third insulating layer and electrically contacting one of the electrodes and the light emitting element; and
a second connection electrode disposed between the third insulating layer and the second insulating layer and electrically contacting one of the electrodes and the light emitting element.

9. The display device of claim 6, further comprising:
color control structures disposed in a region surrounded by the first bank in the display area;
a first capping layer disposed on each of the color control structures and the first bank;
a low refractive layer disposed on the first capping layer; and a second capping layer disposed on the low refractive layer.

10. The display device of claim 9, wherein
the first capping layer covers the second bank and the third bank,
the low refractive layer extends from the display area to the second bank, and
at least a portion of the low refractive layer is disposed in the first valley.

11. The display device of claim 10, wherein the first capping layer is disposed on the third insulating layer on the second bank and the third bank.

12. The display device of claim 10, wherein the second capping layer is disposed on the second bank and the third bank and contact the first capping layer.

13. The display device of claim 9, further comprising:
an upper light absorbing member disposed on the second capping layer and overlapping the first bank;
color filter layers, each being disposed on the second capping layer in a region where the upper light absorbing member is exposed; and
an overcoat layer disposed on the upper light absorbing member and each of the color filter layers.

14. The display device of claim 13, further comprising an upper structure disposed on the second bank and the third bank,
wherein the overcoat layer is disposed in the display area and the non-display area, and extends to the upper structure disposed on the second bank.

15. The display device of claim 9, further comprising a second valley disposed between the second bank and the third bank in the non-display area and penetrating the via layer and the passivation layer.

16. The display device of claim 15, wherein
a portion of each of the first insulating layer and the third insulating layer is disposed in the second valley, and
a portion of each of the first capping layer and the second capping layer is disposed in the second valley and contact each other.

17. The display device of claim 6, further comprising fourth banks disposed on the third insulating layer between the first bank and the first valley.

18. A display device comprising:
a substrate including a display area and a non-display area adjacent to the display area;
sub-pixels disposed in the display area and disposed in a first direction and in a second direction intersecting the first direction, each of the sub-pixels comprising:
a first electrode;
a second electrode spaced apart from the first electrode; and
light emitting elements disposed on the first electrode and the second electrode;
a first insulating layer disposed on the substrate and in the display area and the non-display area and covering the first electrode and the second electrode;
a first bank surrounding the sub-pixels in the display area;
a first valley surrounding the first bank and spaced apart from the first bank in the non-display area;
a second bank surrounding the first valley and spaced apart from the first valley in the non-display area; and
a third bank surrounding the second bank and spaced apart from the second bank in the non-display area, wherein
the first bank, the second bank, and the third bank have an embossed pattern shape and are disposed on the first insulating layer, the first valley has an intaglio pattern shape, and a part of the first insulating layer is disposed in the first valley, and the first insulating layer is disposed between the first bank and the substrate.

19. The display device of claim 18, further comprising fourth banks having an embossed pattern shape between the first bank and the first valley and disposed on the first insulating layer.

20. The display device of claim 19, wherein the fourth banks extend in one direction and are spaced apart from each other in the first direction and the second direction.

21. The display device of claim 20, wherein the fourth banks have a length extending in the one direction greater than a gap between the fourth banks in the one direction.

22. The display device of claim 18, further comprising a second valley having an intaglio pattern shape and disposed between the second bank and the third bank in the non-display area, wherein a part of the first insulating layer is disposed in the second valley.

23. The display device of claim 18, wherein the first bank is disposed further from the substrate than the first insulating layer.

24. The display device of claim 18, wherein the first insulating layer is disposed between the substrate and each of the first bank, the second bank and the third bank.

\* \* \* \* \*